United States Patent
Ohkura et al.

(10) Patent No.: US 7,438,965 B2
(45) Date of Patent: Oct. 21, 2008

(54) PHASE-CHANGE INFORMATION RECORDING MEDIUM, MANUFACTURING METHOD FOR THE SAME, SPUTTERING TARGET, METHOD FOR USING THE PHASE-CHANGE INFORMATION RECORDING MEDIUM AND OPTICAL RECORDING APPARATUS

(75) Inventors: Hiroko Ohkura, Yokohama (JP);
Kazunori Ito, Yokohama (JP); Hiroshi Deguchi, Yokohama (JP); Masaki Kato, Sagamihara (JP); Mikiko Abe, Kawasaki (JP); Hiroyoshi Sekiguchi, Yokohama (JP); Makoto Harigaya, Hiratsuka (JP); Masaru Shinkai, Yokohama (JP)

(73) Assignee: Ricoh Company, Ltd., Tokyo (JP)

( * ) Notice: Subject to any disclaimer, the term of this patent is extended or adjusted under 35 U.S.C. 154(b) by 400 days.

(21) Appl. No.: 11/244,346

(22) Filed: Oct. 4, 2005

(65) Prior Publication Data
US 2006/0077884 A1    Apr. 13, 2006

Related U.S. Application Data

(63) Continuation of application No. PCT/JP2004/011148, filed on Aug. 4, 2004.

(30) Foreign Application Priority Data
Feb. 5, 2004    (JP)    ............... 2004-029923

(51) Int. Cl.
*B32B 3/02*    (2006.01)
(52) U.S. Cl. ............... 428/64.4; 428/64.5; 428/64.6; 430/270.13
(58) Field of Classification Search ............... 428/64.1, 428/64.4, 64.5, 64.6; 430/270.13
See application file for complete search history.

(56) References Cited

U.S. PATENT DOCUMENTS 5,138,572 A    8/1992    Koshino et al.

(Continued)

FOREIGN PATENT DOCUMENTS

EP    0474311 A1    3/1992

(Continued)

OTHER PUBLICATIONS

Taiwan Patent Office, Communication dated May 16, 2008, in Taiwan Patent Application No. 093123518 (Ricoh Company, Ltd.).

*Primary Examiner*—Elizabeth Mulvaney
(74) *Attorney, Agent, or Firm*—Cooper & Dunham LLP

(57) ABSTRACT

It is an object of the present invention to provide a phase-change information recording medium, and the like, which is easy to perform initial crystallization, exhibits good recording sensitivity at a linear velocity as high as 10 double speeds or more with as much capacity as DVD-ROM, is capable of overwrite recording and has good storage reliability. For this purpose, the phase-change information recording medium comprises a substrate and at least a first protective layer, a phase-change recording layer, a second protective layer, and a reflective layer disposed on the substrate in one of this sequence and reverse sequence wherein the phase-change recording layer comprises a composition expressed by $Sn_\alpha Sb_\beta Ga_\gamma Ge_\delta Te_\epsilon - X_\zeta$ (In this regard, X represents at lease one element selected from Ag, Zn, In and Cu. $\alpha$, $\beta$, $\gamma$, $\delta$, $\epsilon$ and $\zeta$ represent composition ratio (atomic percent) of each element and are expressed as $5 \leq \alpha \leq 25$, $40 \leq \beta \leq 91$, $2 \leq \gamma \leq 20$, $2 \leq \delta \leq 20$, $0 \leq \epsilon \leq 10$, $0 \leq \zeta \leq 10$ and $\alpha+\beta+\gamma+\delta+\epsilon+\zeta=100$).

23 Claims, 3 Drawing Sheets

U.S. PATENT DOCUMENTS

| | | | | |
|---|---|---|---|---|
| 5,254,382 | A * | 10/1993 | Ueno et al. | 428/64.5 |
| 5,314,734 | A * | 5/1994 | Nishida et al. | 428/64.2 |
| 5,709,978 | A * | 1/1998 | Hirotsune et al. | 430/270.13 |
| 7,166,415 | B2 * | 1/2007 | Horie et al. | 430/270.13 |
| 7,260,053 | B2 * | 8/2007 | Harigaya et al. | 369/288 |
| 2002/0110063 | A1 | 8/2002 | Yamada et al. | |
| 2003/0214857 | A1 | 11/2003 | Horie et al. | |
| 2004/0115559 | A1* | 6/2004 | Kato et al. | 430/270.13 |
| 2004/0161700 | A1* | 8/2004 | Abe et al. | 430/270.13 |
| 2005/0105438 | A1* | 5/2005 | Hibino et al. | 369/59.12 |
| 2005/0136209 | A1* | 6/2005 | Chin et al. | 428/64.4 |
| 2005/0195729 | A1* | 9/2005 | Miura et al. | 369/275.2 |
| 2006/0228649 | A1* | 10/2006 | Takada et al. | 430/270.13 |
| 2006/0246270 | A1* | 11/2006 | Takada et al. | 428/209 |
| 2007/0283378 | A1* | 12/2007 | Iwasa et al. | 720/718 |

FOREIGN PATENT DOCUMENTS

| | | |
|---|---|---|
| JP | 60-177446 | 9/1985 |
| JP | 61-168145 | 7/1986 |
| JP | 63-155437 | 6/1988 |
| JP | 5-169819 | 7/1993 |
| JP | 9-286174 | 11/1997 |
| JP | 9-286175 | 11/1997 |
| JP | 2000-339751 | 12/2000 |
| JP | 2002-225433 | 8/2002 |
| JP | 2002-225437 | 8/2002 |
| JP | 2002-264515 | 9/2002 |

* cited by examiner

PHASE-CHANGE INFORMATION RECORDING MEDIUM, MANUFACTURING METHOD FOR THE SAME, SPUTTERING TARGET, METHOD FOR USING THE PHASE-CHANGE INFORMATION RECORDING MEDIUM AND OPTICAL RECORDING APPARATUS

CROSS-REFERENCE TO RELATED APPLICATIONS

This is a continuation of Application No. PCT/JP2004/011148, filed on Aug. 4, 2004.

BACKGROUND OF THE INVENTION

1. Field of the Invention

The present invention relates to phase-change information recording medium (hereafter, may be referred to as "phase-change optical information recording medium", "optical recording medium", "optical information recording medium" or "information recording medium") which can perform at least one of recording, reproducing, erasing or rewriting of information by an optical change in the material forming a recording layer induced by laser beam irradiation, manufacturing method for the phase-change information recording medium, sputtering target, method for using the phase-change information recording medium and optical recording apparatus.

2. Description of the Related Art

Presently, a recording layer material of DVD (Digital Versatile Disk) system which can perform a speed recording at 2.5 double speeds (about 8.5 m/s) has been developed and the demand for more high-speed recording is increasing. For this reason, materials for various phase-change recording layer are being investigated. For example, AgInSbTe material (Japanese Patent Application Laid-Open (JP-A) No. 2000-339751 for reference), GeGaSbTe material (JP-A No. 2002-225437 for reference), GeInSbTe material (JP-A No. 2002-264515 for reference), InSbSn material (JP-A Nos. 09-286174 and 09-286175 for reference), and the like have been proposed.

Among these materials for phase-change recording layer used for DVD+RW(Digital Versatile Disc-Rewritable), there is a AgInSbTe material conventionally used for CD-RW which has been reformed to be capable of recording and erasing at high linear velocity. Since this AgInSbTe material corresponds to recording speed of high linear velocity region, a material in which the content of Sb is adjusted to be larger than that of recording material for CD-RW is being used. However, materials of high Sb composition ratio have a problem of lowering the crystallization temperature even though the crystallization speed increases. It is known that a decrease in crystallization temperature causes storage reliability deterioration. This problem of storage reliability of the phase-change information recording medium has been controlled by increasing Ag in the recording material of phase-change recording layer or by adding a quintessence such as Ge to keep it in an acceptable level from a practical standpoint up to 4-double speed DVD medium. However, an increase in the content of Sb for achieving higher linear velocity recording causes rapid decrease in crystallization temperature resulting in an extreme deterioration of amorphous mark stability. For this reason, it is assumed that the limit for making high-speed recording medium utilizing AgInSbTe material fit for practical use is as high as 4-double speed DVD.

On the other hand, GaSb material for high-speed recording material of 4-double speed or more is being investigated. The GaSb material can perform a high-speed recording and at the same time, excels in storage reliability. However, GaSb material has low recording sensitivity because of high melting point of 600° C. and has a drawback of requiring high power for high-speed recording. In addition, the crystallization speed must be accelerated by increasing the content of Sb in order to pursue a speeding up with GaSb material. However, when the content of Sb is 90 atomic percent or more, Sb becomes phase-separated and cannot pursue a uniform initial crystallization. If a uniform initial crystallization cannot be completed, initial recording property from the first recording to about 10 repeated recordings is notably deteriorated and cannot be put to practical use.

Hence, a phase-change optical information recording medium which is easy to perform initial crystallization, exhibits good recording sensitivity at a linear velocity as high as 10 double speeds or more with as much capacity as DVD-ROM, is capable of repeated recording and has excellent storage reliability, and its associated technologies have not yet been provided, and their soon provision is desired under current circumstances.

SUMMARY OF THE INVENTION

An object of the present invention is to provide a phase-change information recording medium which is easy to perform initial crystallization, exhibits good recording sensitivity at a linear velocity as high as 10 double speeds or more with as much capacity as DVD-ROM, is capable of repeated recording and has excellent storage reliability, and the sputtering target for manufacturing the phase-change information recording medium.

When an information is recorded in the phase-change information recording medium by CAV (Constant Angular Velocity) recording system, because recording linear velocity differs depending on the radius location, a phase-change information recording medium of excellent repeated recording property in a broad area of recording linear velocity is required. Therefore, it is an object of the present invention to provide the phase-change information recording medium of excellent repeated recording property in a broad area of recording linear velocity with as much capacity as DVD-ROM, the sputtering target for manufacturing the phase-change information recording medium, the method for using the phase-change information recording medium and the optical recording apparatus.

From a dedicated investigation that has been carried out to settle above issues, it is found that by utilizing alloys that consist mainly of Sn, Sb, Ga and Ge (90 atomic percent or more) as a material forming the phase-change recording layer, an appropriate sensitivity (with a melting point less than that of GaSb) can be obtained. For example, when a DVD recording system of 660 nm wavelength and lens NA=0.65 is used, it is found that satisfactory recording sensitivity, overwrite property and storage reliability can be obtained at a recording speed of about 35 m/s or more and the phase-change information recording medium of excellent repeated recording property in a broad area of recording linear velocity with as much capacity as DVD-ROM can be provided.

The present invention is based on the knowledge of the present inventor and the measures to solve above-mentioned problems are the following.

<1> The phase-change information recording medium comprising a substrate and at least a first protective layer, a phase-change recording layer, a second protective layer, and a reflective layer disposed on the substrate in one of this sequence and reverse sequence, wherein the phase-change recording layer comprises a composition expressed in following Formula 1. Because the phase-change recording layer of the phase-change information recording medium comprises the composition expressed by Formula 1, obtaining the phase-change information recording medium of excellent storage stability which is capable of repeated recording at a recording linear velocity of 3 double speeds or more of DVD with as much capacity as DVD-ROM is possible.

$$Sn_\alpha Sb_\beta Ga_\gamma Ge_\delta Te_\epsilon-X_\zeta \qquad \text{[Formula 1]}$$

In above Formula 1, X represents at least one element selected from Ag, Zn, In and Cu. $\alpha$, $\beta$, $\gamma$, $\delta$, $\epsilon$ and $\zeta$ represent composition ratio (atomic percent) of each element and are expressed as follows:

$5 \leq \alpha \leq 25, 40 \leq \beta \leq 91, 2 \leq \gamma \leq 20, 2 \leq \delta \leq 20, 0 \leq \epsilon \leq 10, 0 \leq \zeta \leq 10$ and $\alpha+\beta+\gamma+\delta+\epsilon+\zeta=100$ <2> The phase-change information recording medium defined in <1>, wherein the phase-change recording layer comprises a composition expressed by following Formula 1. Because the phase-change recording layer of the phase-change information recording medium comprises the composition expressed by Formula 1, obtaining the phase-change information recording medium capable of appropriate repeated recording at a recording linear velocity of 10 double speeds or more of DVD with as much capacity as DVD-ROM is possible.

$$Sn_\alpha Sb_\beta Ga_\gamma Ge_\delta Te_\epsilon-X_\zeta \qquad \text{[Formula 1]}$$

In above Formula 1, X represents at least one element selected from Ag, Zn, In and Cu. $\alpha$, $\beta$, $\gamma$, $\epsilon$, $\epsilon$ and $\zeta$ represent composition ratio (atomic percent) of each element and are expressed as follows:

$5 \leq \alpha \leq 20, 40 \leq \beta \leq 85, 5 \leq \gamma \leq 20, 5 \leq \delta \leq 20, 0 \leq \epsilon \leq 7, 0 \leq \zeta \leq 7$ and $\alpha+\beta++\gamma+\delta+\epsilon+\zeta=100$ <3> The phase-change information recording medium defined in <2>, wherein the phase-change recording layer comprises the composition expressed by following Formula 1. Because the phase-change recording layer of the phase-change information recording medium defined in <3> comprises the composition expressed by Formula 1, obtaining the information recording medium capable of appropriate repeated recording at a recording linear velocity of 3 double speeds to 8 double speeds of DVD is possible. Furthermore, because repeated recording in a broad area of recording linear velocity is good, it is possible to record the information in the phase-change information recording medium by CAV (Constant Angular Velocity) of which the recording linear velocity differs depending on the radius location.

$$Sn_\alpha Sb_\beta Ga_\gamma Ge_\delta Te_\epsilon-X_\zeta \qquad \text{[Formula 1]}$$

In above Formula 1, X represents at least one element selected from Ag, Zn, In and Cu. $\alpha$, $\beta$, $\gamma$, $\delta$, $\epsilon$ and $\zeta$ represent composition ratio (atomic percent) of each element and are expressed as follows:

$10 \leq \alpha \leq 20, 50 \leq \beta \leq 80, 5 \leq \gamma \leq 15, 5 \leq \delta \leq 15, 0 \leq \epsilon \leq 7, 0 \leq \zeta \leq 7$ and $\alpha+\beta+\gamma+\delta+\epsilon+\zeta=100$ <4> The phase-change information recording medium defined in one of <1> to <3>, wherein the phase-change recording layer comprises the composition expressed by following Formula 2.

$$Sn_\alpha Sb_\beta Ga_\gamma Ge_\delta \qquad \text{[Formula 2]}$$

In above Formula 2, $\alpha$, $\beta$, $\gamma$ and $\delta$ represent composition ratio (atomic percent) of each element and are expressed as follows:

$5 \leq \alpha \leq 25, 40 \leq \beta \leq 91, 2 \leq \gamma \leq 20, 2 \leq \delta \leq 20$ and $\alpha+\beta+\gamma+\delta=100$ <5> The phase-change information recording medium defined in <4>, wherein the phase-change recording layer comprises the composition expressed by following Formula 2.

$$Sn_\alpha Sb_\beta Ga_\gamma Ge_\delta \qquad \text{[Formula 2]}$$

In above Formula 2, $\alpha$, $\beta$, $\gamma$ and $\delta$ represent composition ratio (atomic percent) of each element and are expressed as follows:

$5 \leq \alpha \leq 20, 40 \leq \beta \leq 85, 5 \leq \gamma \leq 20, 5 \leq \delta \leq 20$ and $\alpha+\beta+\gamma+\delta=100$ <6> The phase-change information recording medium defined in <5>, wherein the phase-change recording layer comprises the composition expressed by following Formula 2.

$$Sn_\alpha Sb_\beta Ga_\gamma Ge_\delta \qquad \text{[Formula 2]}$$

In above Formula 2, $\alpha$, $\beta$, $\gamma$ and $\delta$ represent composition ratio (atomic percent) of each element and are expressed as follows:

$10 \leq \alpha \leq 20, 50 \leq \beta \leq 80, 5 \leq \gamma \leq 15, 5 \leq \delta \leq 15$ and $\alpha+\beta+\delta=100$ <7> The phase-change information recording medium defined in one of <1> to <6>, wherein the phase-change recording layer performs at least one of recording, reproducing, erasing and rewriting of information through reversible phase-change induced by laser beam irradiation.

<8> The phase-change information recording medium defined in <7>, wherein when the thickness of the first protective layer being $t_1$ (nm), the thickness of the phase-change recording layer being $t_2$ (nm), the thickness of the second protective layer being $t_3$ (nm), the thickness of the reflective layer being $t_4$ (nm), and the wavelength of the laser beam being $\lambda$(nm), the relations of the following formulas, $0.070 \leq t_1/\lambda \leq 0.160$, $0.015 \leq t_2/\lambda \leq 0.032$, $0.005 \leq t_3/\lambda \leq 0.040$, and $0.100 \leq t_4/\lambda$ are satisfied. An appropriate thickness range of the first protective layer, the phase-change recording layer, the second protective layer and the reflective layer of the phase-change information recording medium defined in <8> can be regulated with a relation to laser wavelength $\lambda$ (nm) and if the laser light wavelength used for the record reproduction of the phase-change information recording medium is decided, an appropriate thickness range may be selected following these Formulas and designing a medium is possible.

<9> The phase-change information recording medium defined in one of <1> to <8>, wherein the first protective layer and the second protective layer comprise a mixture of ZnS and $SiO_2$.

<10> The phase-change information recording medium defined in <1> to <9>, wherein the reflective layer comprises one of Ag and Ag alloy.

<11> The phase-change information recording medium defined in <1> to <10>, wherein an interface layer is disposed between the phase-change recording layer and the first protective layer.

<12> The phase-change information recording medium defined in <11>, wherein the interface layer comprises $SiO_2$ and the thickness of the interface layer is 2 nm to 10 nm.

<13> The phase-change information recording medium defined in <1> to <12>, wherein the third protective layer is disposed between the second protective layer and the reflective layer.

<14> A sputtering target comprising a composition expressed by following Formula 1, wherein the sputtering target is used for manufacturing the phase-change recording layer.

$$Sn_\alpha Sb_\beta Ga_\gamma Ge_\delta Te_\epsilon-X_\zeta \qquad \text{[Formula 1]}$$

In above Formula 1, X represents at least one element selected from Ag, Zn, In and Cu. $\alpha$, $\beta$, $\gamma$, $\delta$, $\epsilon$ and $\zeta$ represent composition ratio (atomic percent) of each element and are expressed as follows:

$5 \leq \alpha \leq 25, 40 \leq \beta \leq 91, 2 \leq \gamma \leq 20, 2 \leq \delta \leq 20, 0 \leq \epsilon \leq 10,$
$0 \leq \zeta \leq 10$ and $\alpha+\beta+\gamma+\delta+\epsilon+\zeta=100$ <15> The sputtering target defined in <14>, wherein the composition is expressed by following Formula 1.

$$Sn_\alpha Sb_\beta Ga_\gamma Ge_\delta Te_\epsilon-X_\zeta \qquad \text{[Formula 1]}$$

In above Formula 1, X represents at least one element selected from Ag, Zn, In and Cu. $\alpha$, $\beta$, $\gamma$, $\delta$, $\epsilon$ and $\zeta$ represent composition ratio (atomic percent) of each element and are expressed as follows:

$5 \leq \alpha \leq 20, 40 \leq \beta \leq 85, 5 \leq \gamma \leq 20, 5 \leq \delta \leq 20, 0 \leq \epsilon \leq 7,$
$0 \leq \zeta \leq 7$ and $\alpha+\beta+\gamma+\delta+\epsilon+\zeta=100$ <16> The sputtering target defined in <15>, wherein the composition is expressed by following Formula 1.

$$Sn_\alpha Sb_\beta Ga_\gamma Ge_\delta Ge_\epsilon-X_\zeta \qquad \text{[Formula 1]}$$

In above Formula 1, X represents at least one element selected from Ag, Zn, In and Cu. $\alpha$, $\beta$, $\gamma$, $\delta$, $\epsilon$ and $\zeta$ represent composition ratio (atomic percent) of each element and are expressed as follows:

$10 \leq \alpha \leq 20, 50 \leq \beta \leq 80, 5 \leq \gamma \leq 15, 5 \leq \delta \leq 15, 0 \leq \epsilon \leq 7,$
$0 \leq \zeta \leq 7$ and $\alpha+\beta+\gamma+\delta+\epsilon+\zeta=100$ <17> The sputtering target defined in one of <14> to <16>, wherein the composition is expressed by following Formula 2 and the sputtering target is used for manufacturing the phase-change recording layer.

$$Sn_\alpha Sb_\beta Ga_\gamma Ge_\delta \qquad \text{[Formula 2]}$$

In above Formula 2, $\alpha$, $\beta$, $\gamma$ and $\delta$ represent composition ratio (atomic percent) of each element and are expressed as follows:

$5 \leq \alpha \leq 25, 40 \leq \beta \leq 91, 2 \leq \gamma \leq 20, 2 \leq \delta \leq 20$ and $\alpha+\beta+\gamma+\delta=100$ <18> The sputtering target defined in <17>, wherein the composition is expressed by following Formula 2.

$$Sn_\alpha Sb_\beta Ga_\gamma Ge_\delta \qquad \text{[Formula 2]}$$

In above Formula 2, $\alpha$, $\beta$, $\gamma$ and $\delta$ represent composition ratio (atomic percent) of each element and are expressed as follows:

$5 \leq \alpha \leq 20, 40 \leq \beta \leq 85, 5 \leq \gamma \leq 20, 5 \leq \delta \leq 20$ and $\alpha+\beta+\gamma+\delta=100$ <19> The sputtering target defined in <18>, wherein the composition is expressed by following Formula 2.

$$Sn_\alpha Sb_\beta Ga_\gamma Ge_\delta \qquad \text{[Formula 2]}$$

In above Formula 2, $\alpha$, $\beta$, $\gamma$ and $\delta$ represent composition ratio (atomic percent) of each element and are expressed as follows:

$10 \leq \alpha \leq 20, 50 \leq \beta \leq \gamma 80, 5 \leq \gamma \leq 15, 5 \leq \delta \leq 15$ and $\alpha+\beta+\gamma+\delta=100$ <20> A manufacturing method for the phase-change recording medium comprising phase-change recording layer forming to form the phase-change recording layer by sputtering using the sputtering target defined in one of <14> to <19>, wherein the phase-change information recording medium comprises at least a first protective layer, a phase-change recording layer, a second protective layer and a reflective layer disposed on the substrate in one of this sequence and reverse sequence.

<21> The manufacturing method for the phase-change information recording medium defined in <20> comprising initial crystallization, wherein the phase-change information recording medium is rotated at a certain linear velocity within a range of 10 m/s to 21 m/s and the initial crystallization is performed at a power density of 15 mW/μm² to 40 mW/μm².

<22> A method for using the phase-change information recording medium wherein at least one of recording, reproducing, erasing and rewriting of information is performed by laser beam irradiation from the first protective layer side of the phase-change information recording medium defined in one of <1> to <13>.

<23> An optical recording apparatus wherein at least one of recording, reproducing, erasing and rewriting of information is performed by laser beam irradiation from a laser beam source to the phase-change information recording medium and the phase-change information recording medium is the phase-change information recording medium defined in one of <1> to <13>.

In the method for using the phase-change information recording medium, at least one of recording, reproducing, erasing and rewriting of information is performed by laser beam irradiation to the phase-change information recording medium. As a result, one of recording, reproducing, erasing and rewriting of information can be effectively performed safely with certainty.

In the optical recording apparatus according to the present invention wherein at least one of recording, reproducing, erasing and rewriting of information is performed by laser beam irradiation from a laser beam source to the phase-change information recording medium and above-mentioned phase-change information recording medium is the phase-change information recording medium according to the present invention. In the optical recording apparatus according to the present invention, at least one of recording, reproducing, erasing and rewriting of information can be performed safely with certainty.

Figure 1:
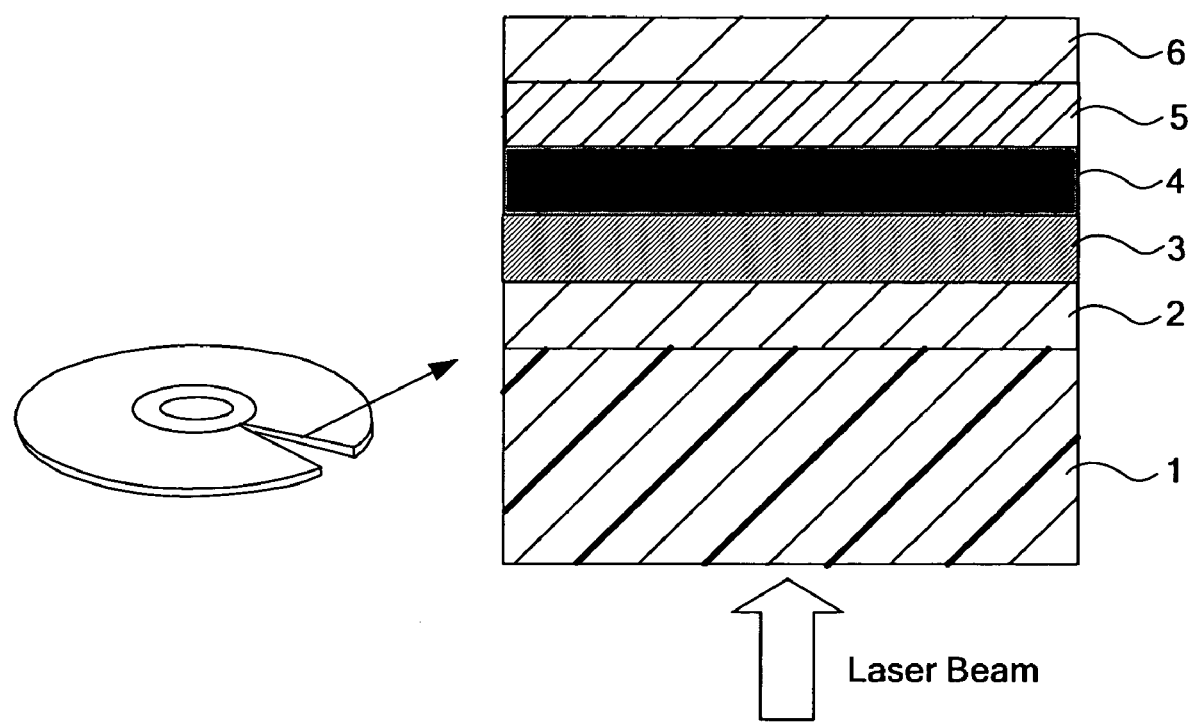
FIG. 1 is a cross-sectional view showing an exemplary phase-change information recording medium of the invention.

DESCRIPTION OF THE PREFERRED EMBODIMENTS (Phase-Change Information Recording Medium)

The phase-change information recording medium of the invention comprises a substrate and at least a first protective layer, a phase-change recording layer, a second protective layer and a reflective layer disposed on the substrate in one of this sequence and reverse sequence and other layers as necessary. In the present case, at least one of recording, reproducing, erasing and rewriting of information is performed by a laser beam irradiated from the first protective layer side of the phase-change information recording medium.

In order to achieve excellent storage stability and repeated recording at 3 double speeds or more of DVD with as much capacity as DVD-ROM, the phase-change recording layer is required to have the composition expressed by Formula 1.

$$Sn_\alpha Sb_\beta Ga_\gamma Ge_\delta Te_\epsilon - X_\zeta \qquad \text{[Formula 1]}$$

In above Formula 1, X represents at least one element selected from Ag, Zn, In and Cu. $\alpha$, $\beta$, $\gamma$, $\delta$, $\epsilon$ and $\zeta$ represent composition ratio (atomic percent) of each element and are expressed as follows:

$$5 \leq \alpha \leq 25, 40 \leq \beta \leq 91, 2 \leq \gamma \leq 20, 2 \leq \delta \leq 20, 0 \leq \epsilon \leq 10,$$
$$0 \leq \zeta \leq 10 \text{ and } \alpha+\beta+\gamma+\delta+\epsilon+\zeta=100$$

In the present case, the phase-change recording layer comprising the composition expressed by Formula 2 is especially preferable.

$$Sn_\alpha Sb_\beta Ga_\gamma Ge_\delta$$

In above Formula 2, $\alpha$, $\beta$, $\gamma$ and $\delta$ represent composition ratio (atomic percent) of each element and are expressed as follows:

$$5 \leq \alpha \leq 25, 40 \leq \beta \leq 91, 2 \leq \gamma \leq 20, 2 \leq \delta \leq 20 \text{ and } \alpha+\gamma+\delta=100$$

Because melting point of $Sn_{50}Sb_{50}$ compound is as low as 425° C. and the speed of crystallization is rapid, there is a potential in materializing a high-speed recording medium of good recording sensitivity. However, the speed of crystallization of $Sn_{50}Sb_{50}$ compound is so rapid that it can be crystallized at a room temperature and there is no way to make it amorphous with current evaluation apparatus for DVD+RW, therefore $Sn_{50}Sb_{50}$ compound alone cannot be used as a phase-change recording layer of DVD+RW. A material capable of repeated recording with excellent storage stability was searched by improving the composition having $Sn_{50}Sb_{50}$ compound as a parent phase. As a result, it was found that an optical recording medium capable of repeated recording with excellent storage stability can be provided by simultaneously adding Ga by which $Sn_{50}Sb_{50}$ compound can easily be crystallized and made amorphous, and Ge having advantageous effect over storage stability. When only Ga is added, a decrease in the reflectance ratio of crystal phase occurs after long-term storage and the shelf property (record reproduction property after being left unattended for extended time), one of the evaluation item for storage stability, is deteriorated. On the other hand, when only Ge is added, length of amorphous mark is fluctuated and jitter property is not improved.

Moreover, because Ga and Ge have an affect of making crystallization speed of $Sn_{50}Sb_{50}$ compound slow, crystallization speed may be altered by controlling Ga+Ge atomic percent. For example, when Ga+Ge is 20 atomic percent or more, recording property at slow speed is especially favorable and at the same time, when Ga+Ge is 10 atomic percent to 15 atomic percent, high-speed recording property at 8 double speeds or more is especially favorable.

In consequence, the phase-change recording layer comprises the composition expressed by following Formula 1. This makes it possible to obtain the phase-change information recording medium of excellent storage stability which is capable of repeated recording at a recording linear velocity of 3 double speeds or more of DVD with as much capacity as DVD-ROM.

$$Sn_\alpha Sb_\beta Ga_\gamma Ge_\delta Te_\epsilon - X_\zeta \qquad \text{[Formula 1]}$$

In above Formula 1, X represents at least one element selected from Ag, Zn, In and Cu. $\alpha$, $\beta$, $\gamma$, $\delta$, $\epsilon$ and $\zeta$ represent composition ratio (atomic percent) of each element and are expressed as follows:

$$5 \leq \alpha \leq 25, 40 \leq \beta \leq 91, 2 \leq \gamma \leq 20, 2 \leq \delta \leq 20, 0 \leq \epsilon \leq 10,$$
$$0 \leq \zeta \leq 10 \text{ and } \alpha+\beta+\gamma+\delta+\epsilon+\zeta=100$$

In the present case, a, $\alpha$, $\beta$, $\gamma$, $\delta$, $\epsilon$ and $\zeta$ are preferably $5 \leq \alpha \leq 20$, $40 \leq \beta \leq 85$, $5 \leq \gamma \leq 20$, $5 \leq \delta \leq 20$, $0 \leq \epsilon \leq 7$, $0 \leq \zeta \leq 7$ and more preferably $\alpha+\beta+\gamma+\delta+\epsilon+\zeta=100$.

$\alpha$, $\beta$, $\gamma$, $\delta$, $\epsilon$ and $\zeta$ are preferably $10 \leq \alpha \leq 20$, $50 \leq \beta \leq 80$, $5 \leq \gamma \leq 15$, $5 \leq \delta \leq 15$, $0 \leq \epsilon \leq 7$, $0 \leq \zeta \leq 7$ and more preferably $\alpha+\beta+\gamma+\delta+\epsilon+\zeta=100$.

The phase-change recording layer, in specific, is preferably of the composition expressed by following Formula 2.

$$Sn_\alpha Sb_\beta Ga_\gamma Ge_\delta \qquad \text{[Formula 2]}$$

In above Formula 2, $\alpha$, $\beta$, $\gamma$ and $\delta$ represent composition ratio (atomic percent) of each element and are expressed as follows:

$$5 \leq \alpha \leq 25, 40 \leq \beta \leq 91, 2 \leq \gamma \leq 20, 2 \leq \delta \leq 20 \text{ and } \alpha+\beta+\gamma+\delta=100$$

In the present case, $\alpha$, $\beta$, $\gamma$ and $\delta$ are preferably $5 \leq \alpha \leq 20$, $40 \leq \beta \leq 85$, $5 \leq \gamma \leq 20$, $5 \leq \delta \leq 20$ and $\alpha+\beta+\gamma+\delta=100$.

$\alpha$, $\beta$, $\gamma$ and $\beta$ are more preferably $10 \leq \alpha \leq 20$, $50 \leq \beta \leq 80$, $5 \leq \gamma \leq 15$, $5 \leq \delta \leq 15$ and $\alpha+\beta+\gamma+\delta=100$.

In the composition expressed by Formulas 1 and 2, when Sn is less than 5 atomic percent, the melting point becomes high and the sensitivity is deteriorated and when Sn is more than 25 atomic percent, crystallization speed become excessively high and amorphousizing may be impossible. Furthermore, when Sb is less than 40 atomic percent, the melting point becomes high and the sensitivity may be deteriorated. In contrary, when Sb is more than 91 atomic percent, storage reliability of amorphous mark may be deteriorated. Moreover, when Ga and Ge are less than 2 atomic percent, storage reliability may be deteriorated. On the other hand, when Ga and Ge is more than 20 atomic percent, crystallization temperature becomes excessively high and initial crystallization may become difficult.

It is favorable to add at least one element selected from Ag, Zn, In and Cu to the phase-change recording layer. This improves storage reliability. The content of these elements is preferably 0 atomic percent to 10 atomic percent and more preferably 0 atomic percent to 7 atomic percent. When the content is more than 10 atomic percent, crystallization temperature becomes excessively high and initial crystallization may become difficult.

Furthermore, it is favorable to add Te to the phase-change recording layer. The content of Te is preferably 0 atomic percent to 10 atomic percent and more preferably 0 atomic percent to 7 atomic percent. This makes initial crystallization easy and a uniform crystal condition become easily obtainable and an increase of jitter from the first time to about 10th time of repeated recording can be lowered.

In the invention, when the thickness of the first protective layer being $t_1$ (nm), the thickness of the phase-change recording layer being $t_2$ (nm), the thickness of the second protective layer being $t_3$ (nm), the thickness of the reflective layer being $t_4$ (nm), and the wavelength of the laser beam being $\lambda$ (nm), it is preferable that the relations of the following formulas, $0.070 \leq t_1/\lambda \leq 0.160$, $0.015 \leq t_2/\lambda \leq 0.032$, $0.005 \leq t_3/\lambda \leq 0.040$, and $0.100 \leq t_4/\lambda$ are satisfied.

For example, in order to maintain DVD-ROM reproduction compatibility, the reflectance ratio of optical recording medium of DVD system with a wavelength of 630 nm to 680 nm should be 18% or more. To satisfy this optical assumption, the thickness of the phase-change recording layer and the first protective layer are mainly controlled while the thickness of the second protective layer and the reflective layer are adjusted to be within a range that satisfies above thickness condition. If the thickness of the phase-change recording layer is too thin, light absorbing power of the recording layer may be deteriorated. If the thickness is too thick, recording sensitivity may be deteriorated. Consequently, the thickness of the phase-change recording layer is preferably in a range of $0.015 \leq t_2/\lambda \leq 0.032$.

When the thickness of the phase-change recording layer is set within the range of $0.015 \leq t_2/\lambda \leq 0.032$, the second thickness range and the third thickness range having more thickness exist other than the first thickness range of $0.070 \leq t_1/\lambda \leq 0.160$ as the thickness condition of the first protective layer satisfying above optical condition. But the second and third thickness range is thicker than the first thickness range and takes more manufacturing time per film; the first thickness range is favorable in materializing a low-cost disc from the manufacturing view point of the phase-change information recording medium. Consequently, thickness of the first protective layer preferably satisfies the relation of the Formula $0.070 \leq t_1/\lambda \leq 0.160$ when the wavelength of the laser beam being $\lambda$.

The second protective layer temporally reserves heat generated by thermal relaxation of light energy absorbed within the phase-change information recording medium (the main body of the absorption is the material of phase-change recording layer), propagates it to the reflective layer and releases. Therefore, it is preferable that the second protective layer is not too much thick, and is preferably within a range of $0.005 \leq t_3/\lambda \leq 0.040$. If the thickness of the second protective layer is thicker than above-mentioned, a recording mark blurs due to gathered heat in the phase-change recording layer, and the recording properties, particularly jitter property is deteriorated. The jitter property is evaluated by a variation in mark edge expressed based on the channel cycle (Tw), $\sigma$/Tw. On the other hand, if the thickness of the second protective layer is thinner than above-mentioned, a problem arises in that satisfactory recording properties cannot be obtained, because absorbed light energy within the phase-change recording layer is released to the reflective layer before reaching the amount capable of exhibiting the principle of phase-change recording, in which light energy absorbed in the phase-change recording layer is accumulated to dissolve the phase-change recording layer, thereby making a record mark.

Because power density of laser beam varies depending on the wavelength used in the recording system, it is required to change the thickness of above-mentioned second protective layer, however, this can be resolved by setting the thickness of the second protective layer within the range that satisfies above-mentioned optical thickness condition. This also applies to the thickness condition of other layers mentioned above.

Next, an exemplary layer structure of the phase-change information recording medium according to the present invention will be described in detail based on the accompanying drawing.

Here, FIG. 1 is a cross-sectional schematic view showing an exemplary phase-change information recording medium according to the present invention, in which a substrate 1, a first protective layer 2, a phase-change recording layer 3, a second protective layer 4, a third protective layer 5 and a reflective layer 6 are laminated on a substrate 1 in the named order. In addition, it is preferable to dispose an interface layer between the phase-change recording layer 3 and the first protective layer 2, although not shown in the drawings. Furthermore, it is also favorable to form a protective layer made of ultraviolet curing resin on the reflective layer by spin coat and other substrates may be bonded on the protective layer as necessary for further reinforcement or protection of the phase-change information recording medium.

Substrate

Generally, glass, ceramics, resin, and the like are used for the material of the substrate 1 and the substrate made from resin is preferable in terms of formability and cost. Examples of resin include polycarbonate resin, acrylate resin, epoxy resin, polystyrene resin, acrylonitrile-styrene copolymer, polyethylene resin, polypropylene resin, silicone resin, fluorine resin, ABS resin, urethane resin, and the like. Of these, polycarbonate resin and acrylate resin are especially preferable in terms of formability, optical properties and cost.

The thickness of substrate 1 is not particularly limited and the thickness is determined by wavelength of the laser or focusing property of the pickup lens generally used. The substrate having a thickness of 1.2 mm is used for CD of 780 nm wavelength and a substrate having a thickness of 0.6 mm is used for DVD of 650 nm to 665 nm wavelength.

A substrate of polycarbonate resin having a race for tracking on its surface, is in a form of a disc of 12 cm diameter and 0.6 mm thickness and having excellent workability and optical property is favorable, for example. The race for tracking is preferably a meandering race within a range of 0.74±0.03 µm pitch, 22 nm to 40 nm depth and 0.2 µm to 0.4 µm width. In particular, by making the race deep, reflectance ratio of the phase-change information recording medium decreases and the modulation depth becomes large.

In addition, an adhesive layer for bonding the substrate 1 where information signal is written in and the bonding substrate is formed of double-sided adhesive sheet of which binder is coated on both sides of the base film, thermo-curing resin or ultraviolet curing resin. The thickness of the adhesive layer is generally about 50 µm.

The bonding substrate (dummy substrate) is not necessary transparent when the adhesive layer is an adhesive sheet or thermo-curing resin, however, when the adhesive layer is an ultraviolet curing resin, it is favorable to use a transparent substrate through which ultraviolet ray is transmitted. In general, the thickness of the bonding substrate is preferably 0.6 mm, as same as the transparent substrate 1 in which information signal is written in.

First Protective Layer

The first protective layer 2 is preferably having good adhesiveness with the substrate and the phase-change recording layer, is highly thermostable, and is also preferably having optical properties suitable for repeated recording at a high linear velocity because it also serves as an optical interference layer which makes an effective light absorption of the phase-change recording layer possible.

Examples of the material for the first protective layer include metal oxides such as SiO, $SiO_2$, ZnO, $SnO_2$, $Al_2O_3$, $TiO_2$, $In_2O_3$, MgO, $ZrO_2$; nitrides such as $Si_3N_4$, AlN, TiN, BN, ZrN; sulfides such as ZnS, $In_2S_3$, $TaS_4$; carbides such as SiC, TaC, $B_4C$, WC, TiC, ZrC; diamond-like carbon or mixtures thereof. Of these, the mixture of ZnS and $SiO_2$ is preferable. The mixture molar ratio (ZnS:$SiO_2$) is preferably 50 to 90:50 to 10 and more preferably 60 to 90:40 to 10.

Examples of the method for forming the first protective layer 2 include various vapor-phase growths such as vacuum evaporation method, sputtering method, plasma CVD method, optical CVD method, ion plating method and electron-beam deposition method. Among these, the sputtering method excels in mass productivity, layer quality, and the like. For example, the following sputtering condition is favorable: Ar gas as a film-forming gas, electricity input of 3 kW and Ar gas pressure of $2 \times 10^{-3}$ Torr (air pressure of film-forming chamber) The thickness of the first protective layer ($t_1$) is preferably 50 nm to 90 nm and satisfying the formula, $0.070 \leq t_1/\lambda \leq 0.160$ when the wavelength of laser beam is regarded as $\lambda$. When it is thinner than this range, it does not function as a heat-resistant protective layer and when it is thicker, interfacial peeling is likely to occur.

Phase-Change Recording Layer

The phase-change recording layer 3 is preferably having a composition expressed by Formulas 1 and 2 as stated above.

The thickness of the phase-change recording layer ($t_2$) is preferably satisfying the formula, $0.015 \leq t_2/\lambda \leq 0.032$ as mentioned above, when the wavelength of laser beam is regarded as $\lambda$. When the thickness of the phase-change recording layer is thinner than this range, light absorbing power decreases and it may not function as a phase-change recording layer and when it is thicker, recording sensitivity may be deteriorated.

Examples of the method for forming the phase-change recording layer include various vapor-phase growths such as vacuum evaporation method, sputtering method, plasma CVD method, optical CVD method, ion plating method and electron-beam deposition method. Among these, the sputtering method excels in mass productivity, layer quality, and the like. For example, the following sputtering condition is favorable: Ar gas as a film-forming gas, electricity input of 1 kW and Ar gas pressure of $2 \times 10^{-3}$ Torr (air pressure of film-forming chamber)

Second Protective Layer

The second protective layer 4 is preferably having good adhesiveness with the substrate and the phase-change recording layer, is highly thermostable and having optical properties suitable for repeated recording at a high linear velocity because it also serves as an optical interference layer which makes an effective light absorption of the phase-change recording layer possible.

Examples of the material for the second protective layer include metal oxides such as SiO, $SiO_2$, ZnO, $SnO_2$, $Al_2O_3$, $TiO_2$, $In_2O_3$, MgO, $ZrO_2$; nitrides such as $Si_3N_4$, AlN, TiN, BN, ZrN; sulfides such as ZnS, $In_2S_3$, $TaS_4$; carbides such as SiC, TaC, $B_4C$, WC, TiC, ZrC; diamond-like carbon or mixtures thereof. Of these, the mixture of ZnS and $SiO_2$ is preferable. The mixture molar ratio (ZnS:$SiO_2$) is preferably 50 to 90:50 to 10 and more preferably 60 to 90:40 to 10.

Examples of the method for forming the second protective layer 4 include various vapor-phase growths such as vacuum evaporation method, sputtering method, plasma CVD method, optical CVD method, ion plating method and electron-beam deposition method. Among these, the sputtering method excels in mass productivity, layer quality, and the like. For example, the following sputtering condition is favorable: Ar gas as a film-forming gas, electricity input of 3 kW and Ar gas pressure of $2 \times 10^{-3}$ Torr (air pressure of film-forming chamber).

The thickness of the second protective layer ($t_3$) is preferably 6 nm to 20 nm and satisfying the formula, $0.005 \leq t_3/\lambda \leq 0.040$ when the wavelength of laser beam is regarded as $\lambda$ as mentioned above. When the thickness of the second protective layer is thinner than this range, recording sensitivity may be deteriorated and when it is thicker, too much heat may be gathered inside.

Reflective Layer

The reflective layer serves as an optical reflective layer while it also serves as a heat dissipation layer for dissipating heat added to the phase-change recording layer by irradiating laser beam at the time of recording. Choosing a material of the reflective layer is quite important in a phase-change information recording medium corresponding to high linear velocity, because an amorphous mark forming is heavily affected by cooling rate through heat dissipation.

For the reflective layer 6, a metallic material, for example, Al, Au, Ag, Cu, Ta, and the like or metal alloys thereof can be used. Further, as an element to be added to these metallic materials, Cr, Ti, Si, Cu, Ag, Pd, Ta or the like can be used. Among these materials, it is preferred that one of Ag and Ag metal alloy is contained therein. This is because a metal with high thermal conductivity and high reflectance is usually desirable for the reflective layer constituting the phase-change information recording medium in terms of thermal conductivity for modulating cooling rate against the heat generated at the time of recording and also in terms of an optical viewpoint of improving the contrast of reproduction signals by utilizing interference effect, and pure Ag or an Ag metal alloy respectively has extremely high thermal conductivity of 427 W/m·K, and a quenching configuration suitable for forming an amorphous mark can be realized immediately after the phase-change recording layer reaches a high temperature at the time of recording.

Pure silver is the most suitable in consideration of its high thermal conductivity, but Cu may be added in consideration of corrosion resistance. In this case, in order not to impair the property of Ag, the range of the copper addition amount is preferably from about 0.1 atomic percent to about 10 atomic percent, and more preferably within the range of 0.5 atomic percent to 3 atomic percent. An excessive addition of copper may deteriorate high heat conductivity of Ag.

Examples of the method for forming the reflective layer 6 include various vapor-phase growths such as vacuum evaporation method, sputtering method, plasma CVD method, optical CVD method, ion plating method and electron-beam deposition method. Among these, the sputtering method excels in mass productivity, layer quality, and the like. For example, the following sputtering condition is favorable: Ar gas as a film-forming gas, electricity input of 5 kW and Ar gas pressure of $2 \times 10^{-3}$ Torr (air pressure of film-forming chamber).

The heat dissipation ability of the reflective layer is basically proportional to the thickness of the layer; however, excellent disc properties are available, if the thickness of the reflective layer is 60 nm or more. In this case, there is no particular maximum limit value thereof, and a thickness within an allowable range from disc manufacturing cost perspective may be used, however, about 300 nm or less is preferable and it is preferable that the thickness of the reflective layer ($t_4$), as described above, satisfies the formula, $0.100 \leq t_4/\lambda$, when the wavelength of laser beam is regarded as λ. When the thickness of the reflective layer is thinner than this range, heat dissipation effect may not be obtained.

It is noted that a resin protective layer may be disposed on the reflective layer 6 as necessary. This resin protective layer has an effect for protecting phase-change recording layer in the process flow when manufactured as a product and it is usually formed through the use of an ultraviolet-curing resin. The thickness of the resin protective layer is preferably within the range of 2 μm to 5 μm.

Third Protective Layer

It is preferred that the third protective layer 5 is disposed between the second protective layer 4 and the reflective layer 6.

Examples of material for the third protective layer 5 include Si, SiC, SiN, $SiO_2$, TiC, $TiO_2$, TiC—$TiO_2$, NbC, $NbO_2$, NbV—$NbO_2$, $Ta_2O_5$, $Al_2O_3$, ITO, GeN, $ZrO_2$, and the like. Among them, TiC—$TiO_2$, Si or SiC is particularly preferable in terms of high-barrier properties.

If a protective layer comprising sulfur such as a mixture of ZnS and $SiO_2$ is used, and when pure Ag or Ag alloy is used for a reflective layer, sulfur will diffuse toward Ag and causes a problem of disc defect (Ag reaction to sulfur). Thus, for the third protective layer for preventing such reaction, it is desirable to select a proper material from the following perspective:

(1) having barrier properties to prevent Ag from reacting to sulfur; (2) being optically transparent to laser beam; (3) having low-thermal conductivity for forming an amorphous mark; (4) having good adhesion to protective layers and reflective layers; and (5) being easy to form. A material mainly made of TiC—$TiO_2$, Si or SiC that satisfies above conditions is suitable for constituent material of the third protective layer.

The thickness of the third protective layer is preferably 2 nm to 20 nm, and more preferably 2 nm to 10 nm. If the thickness is less than 2 nm, the third protective layer may not function as a barrier layer, and if the thickness is more than 20 nm, the modulation degree may be decreased.

Interface Layer

It is preferred that an interface layer is disposed between the first protective layer 2 and the phase-change recording layer 3. The interface layer is preferably containing $SiO_2$ and having thickness of 2 nm to 10 nm. This decreases damages of which the substrate receives when recording at high power and gives advantageous effect over repeated recording property at high power recording; therefore having a wide margin of recording power is possible. If the thickness of the interface layer is less than 2 nm, forming a uniform $SiO_2$ film may be difficult, and if the thickness is more than 10 nm, film separation may become more likely to occur.

The phase-change information recording medium according to the present invention has been described in detail; however, the present invention is not limited to the disclosed aspects and various modifications without departing from the scope of the present invention are acceptable. For example, the present invention may be applied to a phase-change information recording medium in which the same or different types of two phase-change information recording media are bonded together through a resin protective layer instead of a bonding substrate as seen in DVD system.

(Sputtering Target)

The sputtering target according to the present invention has a composition expressed by following Formula 1 and is used for manufacturing the phase-change recording layer.

$$Sn_\alpha Sb_\beta Ga_\gamma Ge_\delta Te_\epsilon - X_\zeta \qquad \text{[Formula 1]}$$

In above Formula 1, X represents at least one element selected from Ag, Zn, In and Cu. α, β, γ, δ, ε and ζ represent composition ratio (atomic percent) of each element and are expressed as follows:

$$5 \leq \alpha \leq 25, 40 \leq \beta \leq 91, 2 \leq \gamma \leq 20, 2 \leq \delta \leq 20, 0 \leq \epsilon \leq 10,$$
$$0 \leq \zeta \leq 10 \text{ and } \alpha+\beta+\gamma+\delta+\epsilon+\zeta=100$$

In the present case, α, β, γ, δ, ε and ζ are preferably $5 \leq \alpha \leq 20$, $40 \leq \beta \leq 85$, $5 \leq \gamma \leq 20$, $5 \leq \delta \leq 20$, $0 \leq \epsilon \leq 7$, $0 \leq \zeta \leq 7$ and $\alpha+\beta+\gamma+\delta+\epsilon+\zeta=100$.

α, β, γ, δ, ε and ζ are more preferably $10 \leq \alpha \leq 20$, $50 \leq \beta \leq 80$, $5 \leq \gamma \leq 15$, $5 \leq \delta \leq 15$, $0 \leq \epsilon \leq 7$, $0 \leq \zeta \leq 7$ and $\alpha+\beta+\gamma+\delta+\epsilon+\zeta=100$.

The sputtering target is preferably having a composition expressed by following Formula 2 and is used for manufacturing the phase-change recording layer.

$$Sn_\alpha Sb_\beta Ga_\gamma Ge_\delta \qquad \text{[Formula 2]}$$

In above Formula 2, α, β, γ and δ represent composition ratio (atomic percent) of each element and are expressed as follows:

$$5 \leq \alpha \leq 25, 40 \leq \beta \leq 91, 2 \leq \gamma \leq 20, 2 \leq \delta \leq 20 \text{ and } \alpha+\beta+\gamma+\delta 100$$

In the present case, α, β, γ and δ are preferably $5 \leq \alpha \leq 20$, $40 \leq \beta \leq 85$, $5 \leq \gamma \leq 20$, $5 \leq \delta \leq 20$ and $\alpha+\beta+\gamma+\delta=100$.

α, β, γ and δ are more preferably $10 \leq \alpha \leq 20$, $50 \leq \beta \leq 80$, $5 \leq \gamma \leq 15$, $5 \leq \delta \leq 15$ and $\alpha+\beta+\gamma+\delta=100$.

The manufacturing method for sputtering target is not particularly limited and may be selected accordingly and a certain prearranged amount is weighed and heat melted in a glass ampoule. And then it is crushed in a mill and obtained powder is heat sintered to manufacture a discoid sputtering target.

By the present invention, a phase-change information recording medium which is easy to perform initial crystallization, exhibits good recording sensitivity at a linear velocity as high as 10 double speeds or more with as much capacity as DVD-ROM, is capable of repeated recording and has good storage reliability, can be provided.

Furthermore, the phase-change information recording medium of good repeated recording property in a broad area of recording linear velocity with as much capacity as DVD-ROM and the sputtering target for manufacturing the phase-change information recording medium can be provided.

(Manufacturing Method for the Phase-Change Recording Medium)

The manufacturing method for the phase-change recording medium of the invention includes at least phase-change recording layer forming, initial crystallization and other steps as necessary.

Phase-Change Recording Layer Forming

The phase-change recording layer forming is a step to form a phase-change recording layer by sputtering using the sputtering target of the invention.

The sputtering is not particularly limited and may be selected from known sputtering accordingly, for example, the sputtering using Ar gas as a film-forming gas, electricity input of 1 kW to 5 kW and gas flow rate of 10 sccm to 40 sccm is favorable. The Ar gas pressure inside the chamber during sputtering is preferably $7.0 \times 10^{-3}$ mTorr (mbar) or less.

Initial Crystallization

The initial crystallization is a step to perform an initial crystallization at a power density of 15 mW/μm to 40 mW/μm while rotating the phase-change information recording medium at a certain velocity within a range of 10 m/s to 21 m/s.

Specifically the initial crystallization is performed by irradiating the light for recording such as laser diode (with an emission wavelength of 600 nm to 720 nm, for example) from the substrate side via objective lens while rotating the phase-change information recording medium at a certain linear velocity or constant angular velocity. The temperature of the phase-change recording layer increases locally as it absorbs irradiated light and information is recorded by generating a pit and modifying its optical property, for example. The reproduction of above-mentioned recorded information can be done by irradiating a laser beam from the first protective layer side while rotating the phase-change information recording medium at a certain linear velocity and detecting the reflected light.

(Method for Using the Phase-Change Information Recording Medium)

The method for using the phase-change information recording medium of the invention wherein at least one of recording, reproducing, erasing and rewriting of information is performed by laser beam irradiation from the first protective layer side of the phase-change information recording medium of the invention.

In the present case, the wavelength of laser beam is preferably 400 nm to 780 nm and more preferably 630 nm to 680 nm.

(Optical Recording Apparatus)

The optical recording apparatus of the invention performs information recording in a phase-change information recording medium by irradiating laser beam from laser beam source to the phase-change information recording medium and the phase-change information recording medium is the phase-change information recording medium of the invention.

The optical recording apparatus is not limited and may be selected accordingly and the example of such apparatus comprises a laser beam source of laser diode, and the like which emits laser beams; a focusing lens which focuses the laser beam emitted from the laser beam source to the optical recording medium mounted on a spindle; optical elements which guides laser beam emitted from the laser beam source to both of the focusing lens and a laser beam detector; the laser beam detector for detecting the reflected light of the laser beam, and other units as necessary.

The optical recording apparatus guides laser beam emitted from the laser beam source to the focusing lens through optical elements to perform recording in a phase-change information recording medium by concentrating and irradiating the laser beam through focusing lens to the phase-change information recording medium. Here, the optical recording apparatus guides the reflected beam of the laser beam to the laser beam detector to control the amount of beam of the laser beam source based on the amount of laser beam detected by the laser beam detector.

The laser beam detector converts the detected amount of laser beam into power voltage or power current and outputs them as a signal of the detected amount.

Examples of other units include controlling unit. The controlling unit is not particularly limited as long as it is able to control movements of the individual units, and may be selected accordingly and examples of controlling unit include sequencer for irradiating and scanning intensely modulated laser beam; equipment such as computer devices, and the like.

EXAMPLES

Herein below, the invention is explained in detail with referring to Examples; however, Examples should not be construed as limiting the scope of the invention.

Example 1

Preparation of Phase-Change Information Recording Medium

A phase-change information recording medium (disc) was prepared as follow. Sputtering was conducted using a sheet sputtering apparatus (Big Sprinter by Unaxis Incorporated) under Ar gas atmosphere with electricity input of 1 kW to 5 kW and Ar gas pressure of $2\times10^{-3}$ Torr.

A polycarbonate resin substrate of 0.74 μm track pitch, 27 nm groove depth, 12 cm diameter and 0.6 mm thickness was provided.

First, using a sputtering target of $(ZnS)_{80}(SiO_2)_{20}$ composition (mole percent), a first protective layer of 80 nm thickness was formed on the substrate by sputtering.

Next, using a sputtering target of $Sn_5Sb_{75}Ga_{13}Ge_7$ composition (atomic percent), a phase-change recording layer of 20 nm thickness was formed on the first protective layer by sputtering.

Next, using the sputtering target of $(ZnS)_{80}(SiO_2)_{20}$ composition (mole percent), a second protective layer of 14 nm thickness was formed on the phase-change recording layer by sputtering.

Next, using a sputtering target of SiC, a third protective layer of 4 nm thickness was formed on the second protective layer by sputtering.

Next, using a sputtering target of Ag, a reflective layer of 180 nm thickness was formed on the third protective layer by sputtering.

Next, an organic protective layer was formed by coating acrylic curing resin of 5 μm to 10 μm thickness on the reflective layer using a spinner and performing ultraviolet-curing afterward.

Finally, a polycarbonate resin substrate of 12 cm diameter and 0.6 mm thickness was bonded to the organic protective layer using an adhesive. With these procedures, the phase-change information recording medium of Example 1 was prepared.

Example 2

Preparation of Phase-Change Information Recording Medium

The phase-change information recording medium of Example 2 was prepared similarly to Example 1, except for forming a phase-change recording layer by sputtering using a sputtering target of $Sn_{25}Sb_{56}Ga_9Ge_{10}$ composition (atomic percent).

Example 3

Preparation of Phase-Change Information Recording Medium

The phase-change information recording medium of Example 3 was prepared similarly to Example 1, except for forming a phase-change recording layer by sputtering using a sputtering target of $Sn_{24}Sb_{41}Ga_{18}Ge_{17}$ composition (atomic percent).

Example 4

Preparation of Phase-Change Information Recording Medium

The phase-change information recording medium of Example 4 was prepared similarly to Example 1, except for forming a phase-change recording layer by sputtering using a sputtering target of $Sn_{10}Sb_{78}Ga_8Ge_4$ composition (atomic percent).

Example 5

Preparation of Phase-Change Information Recording Medium

The phase-change information recording medium of Example 5 was prepared similarly to Example 1, except for forming a phase-change recording layer by sputtering using a sputtering target of $Sn_{19}Sb_{67}Ga_2Ge_{12}$ composition (atomic percent).

Example 6

Preparation of Phase-Change Information Recording Medium

The phase-change information recording medium of Example 6 was prepared similarly to Example 1, except for forming a phase-change recording layer by sputtering using a sputtering target of $Sn_{22}Sb_{55}Ga_{18}Ge_5$ composition (atomic percent).

Example 7

Preparation of Phase-Change Information Recording Medium

The phase-change information recording medium of Example 7 was prepared similarly to Example 1, except for forming a phase-change recording layer by sputtering using a sputtering target of $Sn_{16}Sb_{72}Ga_{10}Ge_2$ composition (atomic percent).

Example 8

Preparation of Phase-Change Information Recording Medium

The phase-change information recording medium of Example 8 was prepared similarly to Example 1, except for forming a phase-change recording layer by sputtering using a sputtering target of $Sn_{22}Sb_{55}Ga_4Ge_{19}$ composition (atomic percent).

Comparative Example 1

Preparation of Phase-Change Information Recording Medium

The phase-change information recording medium of Comparative Example 1 was prepared similarly to Example 1, except for forming a phase-change recording layer by sputtering using a sputtering target of $Sn_3Sb_{60}Ga_{18}Ge_{19}$ composition (atomic percent).

Comparative Example 2

Preparation of Phase-Change Information Recording Medium

The phase-change information recording medium of Comparative Example 2 was prepared similarly to Example 1, except for forming a phase-change recording layer by sputtering using a sputtering target of $Sn_{27}Sb_{67}Ga_4Ge_2$ composition (atomic percent).

Comparative Example 3

Preparation of Phase-Change Information Recording Medium

The phase-change information recording medium of Comparative Example 3 was prepared similarly to Example 1, except for forming a phase-change recording layer by sputtering using a sputtering target of $Sn_{24}Sb_{39}Ga_{18}Ge_{19}$ composition (atomic percent).

Comparative Example 4

Preparation of Phase-Change Information Recording Medium

The phase-change information recording medium of Comparative Example 4 was prepared similarly to Example 1, except for forming a phase-change recording layer by sputtering using a sputtering target of $Sn_{20}Sb_{66}Ga_1Ge_{13}$ composition (atomic percent).

Comparative Example 5

Preparation of Phase-Change Information Recording Medium

The phase-change information recording medium of Comparative Example 5 was prepared similarly to Example 1, except for forming a phase-change recording layer by sputtering using a sputtering target of $Sn_{13}Sb_{52}Ga_{21}Ge_{14}$ composition (atomic percent).

Comparative Example 6

Preparation of Phase-Change Information Recording Medium

The phase-change information recording medium of Comparative Example 6 was prepared similarly to Example 1, except for forming a phase-change recording layer by sputtering using a sputtering target of $Sn_{18}Sb_{61}Ga_{20}Ge_1$ composition (atomic percent).

Comparative Example 7

Preparation of Phase-Change Information Recording Medium

The phase-change information recording medium of Comparative Example 7 was prepared similarly to Example 1, except for forming a phase-change recording layer by sputtering using a sputtering target of $Sn_{15}Sb_{61}Ga_3Ge_{21}$ composition (atomic percent).

<Initial Crystallization>

Initial crystallization of each obtained phase-change information recording medium was performed using laser diode of 810 nm wavelength. In particular, initial crystallization was performed by irradiating laser beam of 25 mW/μm² power density using a beam head of 751 μm beam width while rotating the phase-change information recording medium at a certain linear velocity of 20 m/s and moving at 50 μm/r in radius direction.

<Evaluation>

The evaluation of record reproduction was conducted using an optical disc evaluation apparatus (DDU-1000 by Pulstec Industrial Co., Ltd.) with pickup head of 660 nm wavelength and NA0.65 numerical apertures. The recording linear velocity was set at 10.5 m/s (equivalent of 3 double speeds of DVD) and 28 m/s (equivalent of 8 double speeds of DVD) and recording power was altered corresponding to the linear velocity. Bias power was set at 0.2 mW and erase power was set at 2 mW to 15 mW and each of them was optimized.

C/N ratio of which when 3T was repeatedly recorded for 10 times, a ratio of noise (N) level to signal strength (C: carrier) by spectral analyzer, for each phase-change information recording medium was determined. Each result for Examples 1 to 8 is shown in Table 3 and each result for Comparative Examples 1 to 7 is shown in Table 4.

In addition, when materializing a rewriting optical disc system, its C/N ratio should be at least 45 dB or more.

TABLE 1

|  | Sn (atomic %) | Sb (atomic %) | Ga (atomic %) | Ge (atomic %) |
| --- | --- | --- | --- | --- |
| Example 1 | 5 | 75 | 13 | 7 |
| Example 2 | 25 | 56 | 9 | 10 |
| Example 3 | 24 | 41 | 18 | 17 |
| Example 4 | 10 | 78 | 8 | 4 |
| Example 5 | 19 | 67 | 2 | 12 |
| Example 6 | 22 | 55 | 18 | 5 |
| Example 7 | 16 | 72 | 10 | 2 |
| Example 8 | 22 | 55 | 4 | 19 |

TABLE 2

|  | Sn (atomic %) | Sb (atomic %) | Ga (atomic %) | Ge (atomic %) |
| --- | --- | --- | --- | --- |
| Comparative Example 1 | 3 | 60 | 18 | 19 |
| Comparative Example 2 | 27 | 67 | 4 | 2 |
| Comparative Example 3 | 24 | 39 | 18 | 19 |
| Comparative Example 4 | 20 | 66 | 1 | 13 |
| Comparative Example 5 | 13 | 52 | 21 | 14 |
| Comparative Example 6 | 18 | 61 | 20 | 1 |
| Comparative Example 7 | 15 | 61 | 3 | 21 |

TABLE 3

| | C/N Ratio (dB) after 3TDOW for 10 times | |
| --- | --- | --- |
|  | Linear Velocity: 10.5 m/s | Linear Velocity: 28 m/s |
| Example 1 | 53 | 49 |
| Example 2 | 51 | 48 |
| Example 3 | 52 | 46 |
| Example 4 | 49 | 50 |
| Example 5 | 47 | 51 |
| Example 6 | 50 | 47 |
| Example 7 | 48 | 52 |
| Example 8 | 51 | 47 |

From the results shown in Table 3, it is noted that all the C/N ratio of the phase-change information recording medium of Examples 1 to 8 were 45 dB or more, when the repeated recording was performed at recording linear velocity of 10.5 m/s which is equivalent of 3 double speeds of DVD or when it was performed at 28 m/s which is equivalent of 8 double speeds of DVD.

TABLE 4

| | C/N Ratio (dB) after 3TDOW for 10 times | |
| --- | --- | --- |
|  | Linear Velocity: 10.5 m/s | Linear Velocity: 28 m/s |
| Comparative Example 1 | 51 | 37 |
| Comparative Example 2 | 36 | 39 |
| Comparative Example 3 | 42 | 38 |
| Comparative Example 4 | 41 | 39 |
| Comparative Example 5 | 40 | 38 |
| Comparative Example 6 | 42 | 41 |
| Comparative Example 7 | 40 | 41 |

From the results shown in Table 4, it is noted that all the C/N ratio of the phase-change information recording medium of Comparative Examples 1 to 7 were 45 dB or less, when the repeated recording was performed at recording linear velocity of 10.5 m/s or at recording linear velocity of 28 m/s except for the result of Comparative Example 1 when the repeated recording was performed at recording linear velocity of 10.5 m/s.

Example 9

Preparation of Phase-Change Information Recording Medium

A phase-change information recording medium (disc) was prepared as follow. Sputtering was conducted using a sheet sputtering apparatus (Big Sprinter by Unaxis Incorporated) under Ar gas atmosphere with electricity input of 1 kW to 5 kW and Ar gas pressure of $2 \times 10^{-3}$ Torr.

A polycarbonate resin substrate of 0.74 μm track pitch, 27 nm groove depth, 12 cm diameter and 0.6 mm thickness was provided.

First, using a sputtering target of $(ZnS)_{80} (SiO_2)_{20}$ composition (mole percent), a first protective layer of 70 nm thickness was formed on the substrate by sputtering.

Next, using a sputtering target of $Sn_{18}Sb_{55}Ga_{11}Ge_{16}$ composition (atomic percent), a phase-change recording layer of 18 nm thickness was formed on the first protective layer by sputtering.

Next, using the sputtering target of $(ZnS)_{80} (SiO_2)_{20}$ composition (mole percent), a second protective layer of 10 nm thickness was formed on the phase-change recording layer by sputtering.

Next, using a sputtering target of SiC, a third protective layer of 4 nm thickness was formed on the second protective layer by sputtering.

Next, using a sputtering target of Ag, a reflective layer of 140 nm thickness was formed on the third protective layer by sputtering.

Next, an organic protective layer was formed by coating acrylic curing resin of 5 μm to 10 μm thickness on the reflective layer using a spinner and performing ultraviolet-curing afterward.

Finally, a polycarbonate resin substrate of 12 cm diameter and 0.6 mm thickness was bonded to the organic protective layer using an adhesive. With these procedures, the phase-change information recording medium of Example 9 was prepared.

Example 10

Preparation of Phase-Change Information Recording Medium

The phase-change information recording medium of Example 10 was prepared similarly to Example 9, except for forming a phase-change recording layer by sputtering using a sputtering target of $Sn_{19}Sb_{50}Ga_{14}Ge_{17}$ composition (atomic percent).

Example 11

Preparation of Phase-Change Information Recording Medium

The phase-change information recording medium of Example 11 was prepared similarly to Example 9, except for forming a phase-change recording layer by sputtering using a sputtering target of $Sn_{17}Sb_{59}Ga_{12}Ge_{12}$ composition (atomic percent).

Example 12

Preparation of Phase-Change Information Recording Medium

The phase-change information recording medium of Example 12 was prepared similarly to Example 9, except for forming a phase-change recording layer by sputtering using a sputtering target of $Sn_{16}Sb_{50}Ga_{16}Ge_{13}Ag_5$ composition (atomic percent).

Example 13

Preparation of Phase-Change Information Recording Medium

The phase-change information recording medium of Example 13 was prepared similarly to Example 9, except for forming a phase-change recording layer by sputtering using a sputtering target of $Sn_{10}Sb_{62}Ga_{10}Ge_{13}In_5$ composition (atomic percent).

Example 14

Preparation of Phase-Change Information Recording Medium

The phase-change information recording medium of Example 14 was prepared similarly to Example 9, except for forming a phase-change recording layer by sputtering using a sputtering target of $Sn_{15}Sb_{70}Ga_5Ge_8Zn_2$ composition (atomic percent).

Example 15

Preparation of Phase-Change Information Recording Medium

The phase-change information recording medium of Example 15 was prepared similarly to Example 9, except for forming a phase-change recording layer by sputtering using a sputtering target of $Sn_{15}Sb_{70}Ga_3Ge_8Cu_4$ composition (atomic percent).

Comparative Example 8

Preparation of Phase-Change Information Recording Medium

The phase-change information recording medium of Comparative Example 8 was prepared similarly to Example 9, except for forming a phase-change recording layer by sputtering using a sputtering target of $Ag_3In_4Sb_{75}Te_{18}$ composition (atomic percent).

Comparative Example 9

Preparation of Phase-Change Information Recording Medium

The phase-change information recording medium of Comparative Example 9 was prepared similarly to Example 9, except for forming a phase-change recording layer by sputtering using a sputtering target of $Ge_5Ga_4Sb_{80}Te_{11}$ composition (atomic percent).

<Initial Crystallization>

Initial crystallization of each obtained phase-change information recording medium was performed using laser diode of 810 nm wavelength. In particular, initial crystallization was performed by irradiating laser beam of 25 mW/μm² power density with a beam head of 75 μm beam width while rotating the phase-change information recording medium at a certain linear velocity of 20 m/s and moving at 50 μm/r in radius direction.

<Evaluation>

The evaluation of record reproduction was conducted using an optical disc evaluation apparatus (DDU-1000 by Pulstec Industrial Co., Ltd.) with a pickup head of 660 nm wavelength and NA0.65 numerical apertures. The recording linear velocity was set at 17.5 m/s, 24.5 m/s and 35.0 m/s, and recording power was altered corresponding to linear velocity. Bias power was set at 0.2 mW and erase power was set at 2 mW to 15 mW and each of them was optimized. Each recording strategy was also optimized. All reproduction was performed at 3.5 m/s linear velocity and 0.7 mW power.

The jitter is a standardized value of data-to-clock jitter σ using detection window width, Tw. Results of each evaluation are shown in Table 6.

<Storage Stability Evaluation>

Storage stability was evaluated by following standards from the degree of jitter elevation after record mark was written in each sample and it was retained in a thermostatic chamber of 80° C. and 85%RH for 300 hours. Results are shown in Table 6.

[Evaluation Standards]
A: jitter elevation is less than 1%
B: jitter elevation is 1% or more and less than 3%
C: jitter elevation is 3% or more <Reproduction Beam Stability Evaluation>

Reproduction beam stability was evaluated by following standards from the degree of jitter elevation after record mark was written in each sample and it was irradiated with a reproduction beam at 3.5 m/s linear velocity and 1.0 mW power for 10 minutes. Results are shown in Table 6.

A: jitter elevation is less than 1%
B: jitter elevation is 1% or more and less than 3%
C: jitter elevation is 3% or more

TABLE 5

| | Sn (atomic %) | Sb (atomic %) | Ga (atomic %) | Ge (atomic %) | Other Elements (atomic %) |
|---|---|---|---|---|---|
| Example 9 | 18 | 55 | 11 | 16 | — |
| Example 10 | 19 | 50 | 14 | 17 | — |
| Example 11 | 17 | 59 | 12 | 12 | — |
| Example 12 | 16 | 50 | 16 | 13 | Ag: 5 |
| Example 13 | 10 | 62 | 10 | 13 | In: 5 |
| Example 14 | 15 | 70 | 5 | 8 | Zn: 2 |
| Example 15 | 15 | 70 | 3 | 8 | Cu: 4 |
| | Ag (atomic %) | In (atomic %) | Sb (atomic %) | Te (atomic %) | Other Elements (atomic %) |
| Comparative Example 8 | 3 | 4 | 75 | 18 | — |
| | Ge (atomic %) | Ga (atomic %) | Sb (atomic %) | Te (atomic %) | Other Elements (atomic %) |
| Comparative Example 9 | 5 | 4 | 80 | 11 | — |

TABLE 6

| | Linear Velocity (m/s) | Recording Power (mW) | Jitter (%) after overwrite first time | Jitter (%) after overwrite 100th time | Jitter (%) after overwrite 1,000th time | Storage Stability | Reproduction Beam Stability |
|---|---|---|---|---|---|---|---|
| Example 9 | 17.5 | 18 | 7.8 | 7.8 | 8.5 | A | A |
| | 24.5 | 24 | 7.6 | 7.7 | 8.6 | A | A |
| | 35.0 | 34 | 7.5 | 7.9 | 8.8 | A | A |
| Example 10 | 17.5 | 18 | 7.7 | 7.6 | 8.9 | A | A |
| | 24.5 | 24 | 7.4 | 7.7 | 8.9 | A | A |
| | 35.0 | 34 | 7.3 | 7.9 | 9.1 | A | A |
| Example 11 | 17.5 | 18 | 7.4 | 7.8 | 8.8 | A | A |
| | 24.5 | 24 | 7.5 | 8.1 | 9.2 | A | A |
| | 35.0 | 34 | 7.9 | 8.2 | 9.3 | A | A |
| Example 12 | 17.5 | 18 | 7.4 | 7.6 | 7.9 | A | A |
| | 24.5 | 24 | 7.5 | 7.7 | 8.1 | A | A |
| | 35.0 | 34 | 7.3 | 7.7 | 8.1 | A | A |
| Example 13 | 17.5 | 18 | 7.2 | 7.2 | 7.5 | A | A |
| | 24.5 | 24 | 7.5 | 7.7 | 7.9 | A | A |
| | 35.0 | 34 | 7.2 | 7.3 | 7.9 | A | A |
| Example 14 | 17.5 | 18 | 7.3 | 7.8 | 8.3 | A | A |
| | 24.5 | 24 | 7.6 | 7.9 | 8.5 | A | A |
| | 35.0 | 34 | 7.8 | 7.9 | 8.6 | A | A |
| Example 15 | 17.5 | 18 | 7.2 | 7.6 | 8.2 | A | A |
| | 24.5 | 24 | 7.5 | 7.8 | 8.4 | A | A |
| | 35.0 | 34 | 7.5 | 7.8 | 8.5 | A | A |
| Comparative Example 8 | 17.5 | 20 | 8.9 | 9.5 | 10.6 | A | B |
| | 24.5 | 26 | 8.8 | 9.3 | 10.7 | A | B |
| | 35.0 | 38 | 13.4 | 15.1 | 19.9 | B | C |
| Comparative Example 9 | 17.5 | 18 | 8.2 | 9.3 | 15.3 | B | A |
| | 24.5 | 24 | 9.2 | 10.8 | 18.2 | C | A |
| | 35.0 | 34 | 18.8 | >20 | >20 | C | B |

From the results shown in Table 6, it was concluded that the initial crystallization of the phase-change information recording medium of Examples 9 to 15 could be easily performed and reflectance ratio was uniform in circumference. The melting point was within a range of 400° C. to 600° C. and the jitter indicated 10% or less even after 1,000th time of overwrites at each recording linear velocity of 17.5 m/s, 24.5 m/s and 35.0 m/s, and the phase-change information recording medium of good recording sensitivity and storage stability have been obtained. In addition, modulation depth of each sample indicated 60% or more even after 1,000th time of overwrites and it was almost unaltered after the storage stability test. In particular, there was no change in the phase-change information recording medium of Examples 12 and 13 even after they were retained in a thermostatic chamber of 80° C. and 85%RH for 600 hours. The reflectance ratio indicated 20% or more after 1,000th time of overwrites and it was almost unaltered after the storage stability test.

In contrary, the phase-change information recording medium of Comparative Example 8 required higher recording power than Examples 9 to 15. When linear velocity was 35.0 m/s, jitter was as high as 13.4% and modulation depth was as low as 50% with writing at 38 mW which is the limit for used laser diode (LD). When the recording linear velocity was 17.5 m/s or 24.5 m/s, storage stability was appropriate, however, when the recording linear velocity was 35.0 m/s, it was assumed that the amorphous mark could not be formed satisfactory and therefore deterioration rate was rapid.

For the phase-change information recording medium of Comparative Example 9, when the recording linear velocity was 17.5 m/s, although jitter was 10% or less until 100th time of overwrites, jitter was elevated to 15.3% at 1,000th time. In the storage stability test, jitter elevation was less than 3%. In addition, in terms of reflectance ratio, jitter was 23% before the storage test, however, it dropped to 16% after the test and there seems to be a problem in storage stability. Reproduction beam stability was appropriate. When the recording linear velocity was 35.0 m/s, initial jitter was as high as 18.8% and this was assumed that the writing of amorphous mark was not satisfactory at this recording linear velocity because of slow speed of crystallization.

Example 16

Preparation of Phase-Change Information Recording Medium

A phase-change information recording medium (disc) was prepared as follow. Sputtering was conducted using a sheet sputtering apparatus (Big Sprinter by Unaxis Incorporated) under Ar gas atmosphere with electricity input of 1 kW to 5 kW and Ar gas pressure of $2 \times 10^{-3}$ Torr.

A polycarbonate resin substrate of 0.74 μm track pitch, 27 nm groove depth, 12 cm diameter and 0.6 mm thickness was provided.

First, using a sputtering target of $(ZnS)_{80} (SiO_2)_{20}$ composition (mole percent), a first protective layer of 60 nm thickness was formed on the substrate by sputtering.

Next, using a sputtering target of $Sn18Sb_{69}Ga_6Ge_7$ composition (atomic percent), a phase-change recording layer of 16 nm thickness was formed on the first protective layer by sputtering.

Next, using the sputtering target of $(ZnS)_{80} (SiO_2)_{20}$ composition (mole percent), a second protective layer of 8 nm thickness was formed on the phase-change recording layer by sputtering.

Next, using a sputtering target of SiC, a third protective layer of 4 nm thickness was formed on the second protective layer by sputtering.

Next, using a sputtering target of Ag, a reflective layer of 140 nm thickness was formed on the third protective layer by sputtering.

Next, an organic protective layer was formed by coating acrylic curing resin of 5 μm to 10 μm thickness on the reflective layer using a spinner and performing ultraviolet-curing afterward.

Finally, a polycarbonate resin substrate of 12 cm diameter and 0.6 mm thickness was bonded to the organic protective layer using an adhesive. With these procedures, the phase-change information recording medium of Example 16 was prepared.

<Initial Crystallization>

Initial crystallization was performed by irradiating a laser beam of 25 mW/μm² power density using a beam head of 75 μm beam width while rotating the phase-change information recording medium at a certain linear velocity of 20 m/s and moving at 50 μm/r in radius direction.

<Evaluation>

The evaluation of record reproduction was conducted using an optical disc evaluation apparatus (DDU-1000 by Pulstec Industrial Co., Ltd.) with a pickup head of 660 nm wavelength and NA0.65 numerical apertures. The recording linear velocity was set at 10.5 m/s (3 double speeds), 14 m/s (4 double speeds), 21 m/s (6 double speeds) and 28 m/s (8 double speeds) and recording power was altered corresponding to linear velocity. Bias power was set at 0.2 mW and erase power was set at 5 mW to 10 mW and each of them was optimized.

Figure 2:
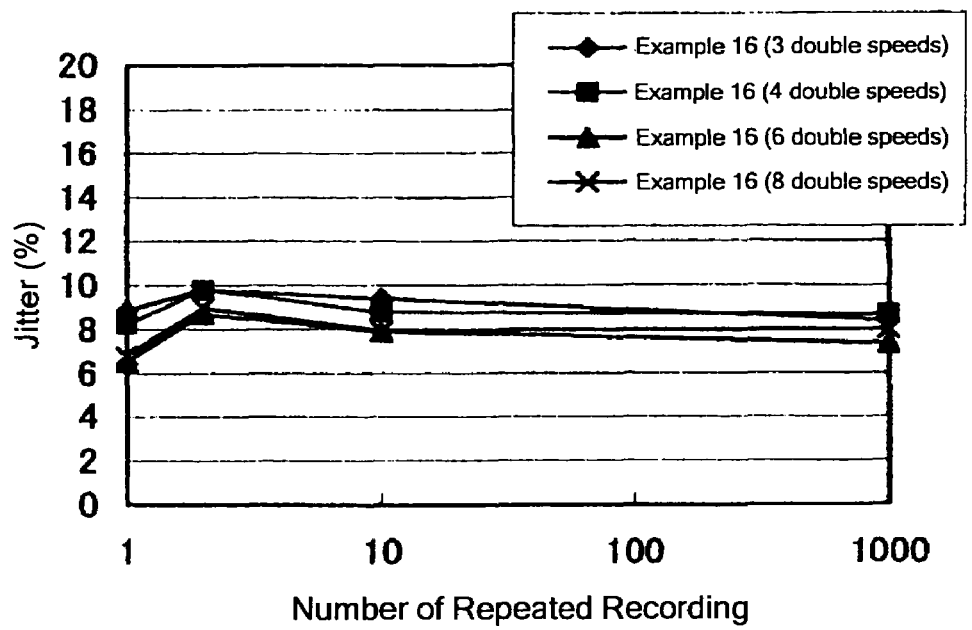
FIG. 2 is a graph showing the jitter from the first time to 1,000th time of repeated recording of the phase-change information recording medium of Example 16.

Each jitter of repeated recording from the first time to 1,000th time is shown in FIG. 2. From the results shown in FIG. 2, it is noted that jitter was 10% or less at every recording linear velocity evaluated. In order to actualize a rewriting optical disc system, at least jitter of 10% or less is required.

Example 17

Preparation of Phase-Change Information Recording Medium

The phase-change information recording medium (disc) of Example 17 was prepared similarly to Example 16, except for forming a phase-change recording layer by sputtering using a sputtering target of $Ga_6Sb_{67}Sn_{18}Ge_6Te_3$ composition (atomic percent).

<Initial Crystallization>

Initial crystallization was performed by irradiating a laser beam of 20 mW/μm² power density using a beam head of 75 μm beam width while rotating the phase-change information recording medium at a certain linear velocity of 15 m/s and moving at 50 μm/r in radius direction.

<Evaluation>

Figure 3:
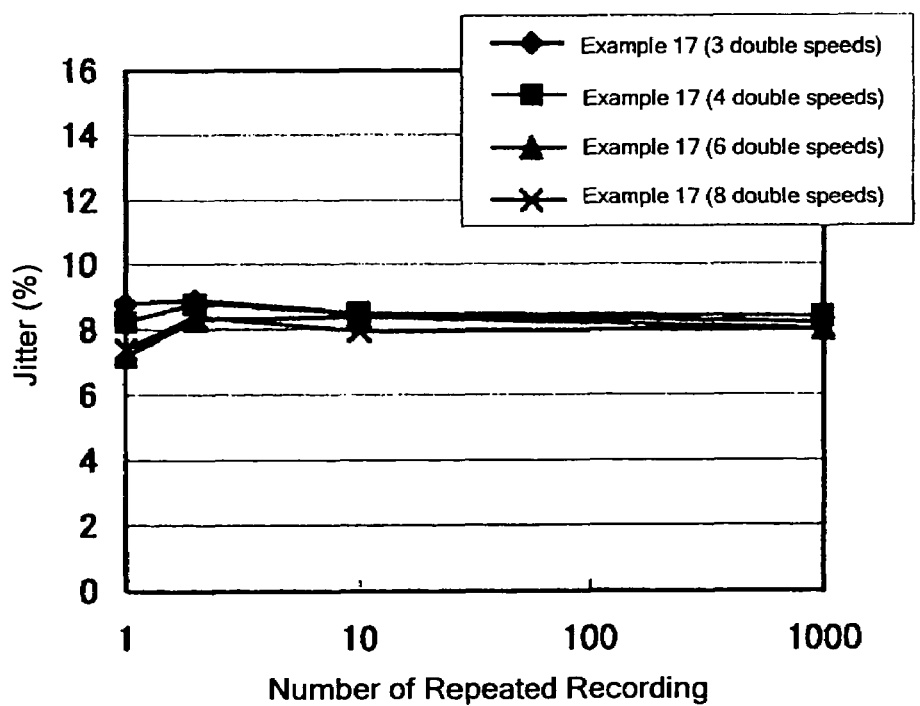
FIG. 3 is a graph showing the jitter from the first time to 1,000th time of repeated recording of the phase-change information recording medium of Example 17.

Obtained phase-change information recording medium was evaluated similarly to Example 16. Results are shown in FIG. 3. From the results shown in FIG. 3, it is noted that the jitter of repeated recording from the first time to 10th time in particular were better and fell within DVD standards of 9% or less.

Example 18

Preparation of Phase-Change Information Recording Medium

The phase-change information recording medium (disc) of Example 18 was prepared similarly to Example 16, except for forming an interface layer of $SiO_2$ with a thickness of 2 nm between the first protective layer and the phase-change recording layer.

<Initial Crystallization>

Initial crystallization was performed by irradiating a laser beam of 25 mW/μm² power density using a beam head of 75 μm beam width while rotating the phase-change information recording medium at a certain linear velocity of 20 m/s and moving at 50 μm/r in radius direction.

<Evaluation>

The repeated recording properties at a recording linear velocity of 28 m/s (8 double speeds) of obtained phase-change information recording medium were evaluated at each recording power of 28 mW, 30 mW, 32 mW, 34 mW, 36 mW and 38 mW.

Figure 4:
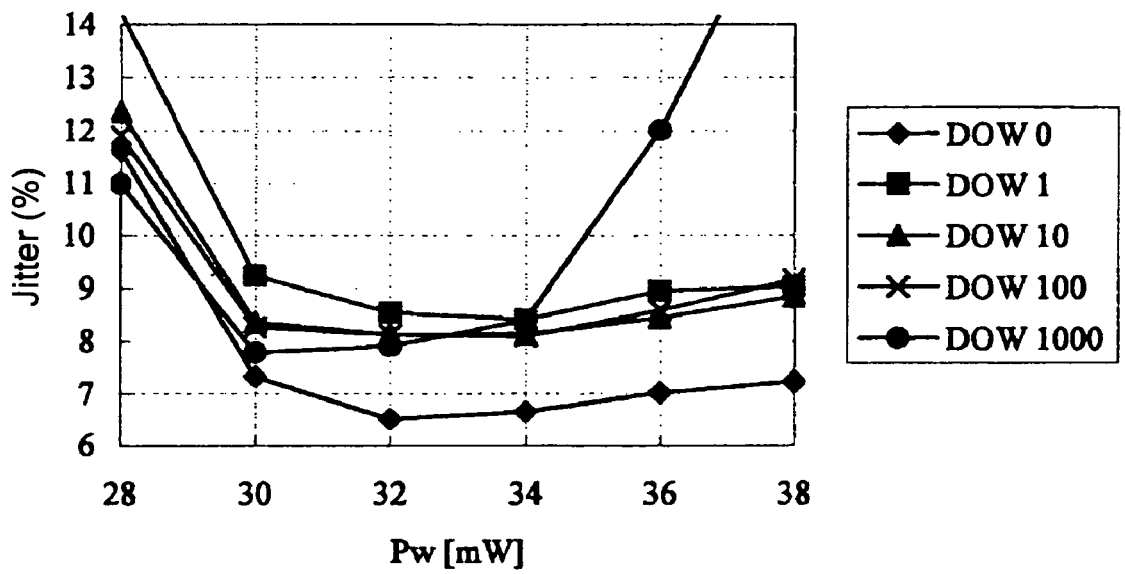
FIG. 4 is a graph showing the repeated recording property of the phase-change information recording medium of Example 16.
Figure 5:
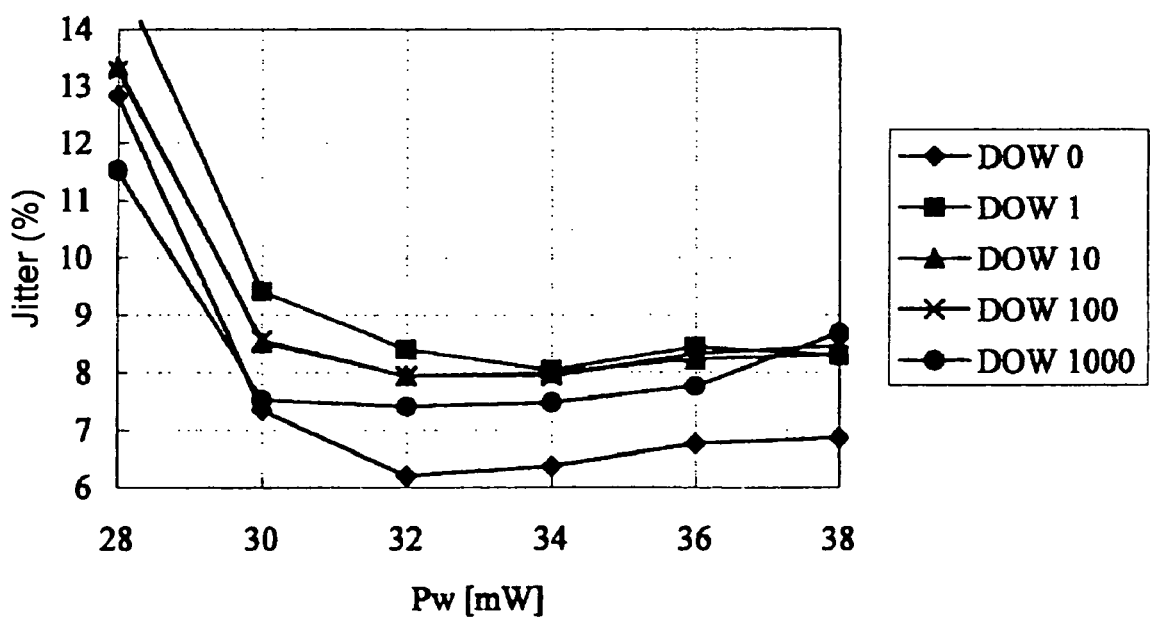
FIG. 5 is a graph showing the repeated recording property of the phase-change information recording medium of Example 18.

The results of Example 16 are shown in FIG. 4 and the results of Example 18 are shown in FIG. 5.

From the results shown in FIGS. 4 and 5, jitter was 9% or less for both Examples 16 and 18 at their most suitable powers. In example 18 in particular, jitter of repeated recording at 1,000th time was 9% or less even at a power of as high as 36 mW or more. By disposing an interface layer of $SiO_2$, it is recognized that the repeated recording property at high power recording was better and expanding the margin of recording power was possible.

The phase-change information recording medium according to the present invention is easy to perform initial crystallization, exhibits good recording sensitivity at a linear velocity as high as 10 double speeds or more with as much capacity as DVD-ROM, is capable of repeated recording and has excellent storage reliability. Therefore, it can be widely used in various phase-change information recording medium, in particular, optical recording medium of DVD system such as DVD-RAM, DVD-RW, DVD+RW, and the like.

What is claimed is:

1. A phase-change information recording medium comprising:
a substrate, and
at least a first protective layer, a phase-change recording layer, a second protective layer, and a reflective layer disposed on the substrate in one of this sequence and reverse sequence,
wherein the phase-change recording layer comprises a composition expressed by following Formula 1:

$$Sn_\alpha Sb_\beta Ga_\gamma Ge_\delta Te_\epsilon -X_\zeta \qquad \text{[Formula 1]}$$

In above Formula 1, X represents at least one element selected from Ag, Zn, In and Cu. $\alpha$, $\beta$, $\gamma$, $\delta$, $\epsilon$ and $\zeta$ respectively represent composition ratio (atomic percent) of each element and are expressed as follows:

$$5 \leq \alpha \leq 25, 40 \leq \beta \leq 91, 2 \leq \gamma \leq 20, 2 \leq \delta \leq 20, 0 \leq \epsilon \leq 10,$$
$$0 \leq \zeta \leq 10 \text{ and } \alpha+\beta+\gamma+\delta+\epsilon+\zeta=100.$$

2. The phase-change information recording medium according to claim 1, wherein the phase-change recording layer comprises the composition expressed by following Formula 1:

$$Sn_\alpha Sb_\beta Ga_\gamma Ge_\delta Te_\epsilon -X_\zeta \qquad \text{[Formula 1]}$$

In above Formula 1, X represents at least one element selected from Ag, Zn, In and Cu. $\alpha$, $\beta$, $\gamma$, $\delta$, $\epsilon$ and $\zeta$ represent composition ratio (atomic percent) of each element and are expressed as follows:

$$5 \leq \alpha \leq 20, 40 \leq \beta \leq 85, 5 \leq \gamma \leq 20, 5 \leq \delta \leq 20, 0 \leq \epsilon \leq 7,$$
$$0 \leq \zeta \leq 7 \text{ and } \alpha+\beta+\gamma+\delta+\epsilon+\zeta=100.$$

3. The phase-change information recording medium according to claim 2, wherein the phase-change recording layer comprises the composition expressed by following Formula 1:

$$Sn_\alpha Sb_\beta Ga_\gamma Ge_\delta Te_\epsilon -X_\zeta \qquad \text{[Formula 1]}$$

In above Formula 1, X represents at least one element selected from Ag, Zn, In and Cu. $\alpha$, $\beta$, $\gamma$, $\delta$, $\epsilon$ and $\zeta$ represent composition ratio (atomic percent) of each element and are expressed as follows:

$$10 \leq \alpha \leq 20, 50 \leq \beta \leq 80, 5 \leq \gamma \leq 15, 5 \leq \delta \leq 15, 0 \leq \epsilon \leq 7,$$
$$0 \leq \zeta \leq 7 \text{ and } \alpha+\beta+\gamma+\delta+\epsilon+\zeta=100.$$

4. The phase-change information recording medium according to claim 1, wherein the phase-change recording layer comprises a composition expressed by following Formula 2:

$$Sn_\alpha Sb_\beta Ga_\gamma Ge_\delta \qquad \text{[Formula 2]}$$

In above Formula 2, $\alpha$, $\beta$, $\gamma$ and $\delta$ represent composition ratio (atomic percent) of each element and are expressed as follows:

$$5 \leq \alpha \leq 25, 40 \leq \beta \leq 91, 2 \leq \gamma \leq 20, 2 \leq \delta \leq 20 \text{ and } \alpha+\beta+\gamma+\delta=100.$$

5. The phase-change information recording medium according to claim 4, wherein the phase-change recording layer comprises the composition expressed by following Formula 2:

$$Sn_\alpha Sb_\beta Ga_\gamma Ge_\delta \qquad \text{[Formula 2]}$$

In above Formula 2, $\alpha$, $\beta$, $\gamma$ and $\delta$ represent composition ratio (atomic percent) of each element and are expressed as follows:

$$5 \leq \alpha \leq 20, 40 \leq \beta \leq 85, 5 \leq \gamma \leq 20, 5 \leq \delta \leq 20 \text{ and } \alpha+\beta+\gamma+\delta=100.$$

6. The phase-change information recording medium according to claim 5, wherein the phase-change recording layer comprises the composition expressed by following Formula 2:

$$Sn_\alpha Sb_\beta Ga_\gamma Ge_\delta \qquad \text{[Formula 2]}$$

In above Formula 2, $\alpha$, $\beta$, $\gamma$ and $\delta$ represent composition ratio (atomic percent) of each element and are expressed as follows:

$$10 \leq \alpha \leq 20, 50 \leq \beta \leq 80, 5 \leq \gamma \leq 15, 5 \leq \delta \leq 15 \text{ and } \alpha+\beta+\gamma+\delta=100.$$

7. The phase-change information recording medium according to claim 1, wherein the phase-change recording layer performs at least one of recording, reproducing, erasing and rewriting of information through reversible phase-change induced by laser beam irradiation.

8. The phase-change information recording medium according to claim 7, wherein when the thickness of the first protective layer being $t_1$ (nm), the thickness of the phase-change recording layer being $t_2$ (nm), the thickness of the second protective layer being $t_3$ (nm), the thickness of the reflective layer being $t_4$ (nm), and the wavelength of the laser beam being $\lambda$ (nm), the relations of the following formulas are satisfied:

$$0.070 \leq t_1/\lambda \leq 0.160, 0.015 \leq t_2/\lambda \leq 0.032, 0.005 \leq t_3/\lambda \leq 0.040, \text{ and } 0.100 \leq t_4/\lambda.$$

9. The phase-change information recording medium according to claim 1, wherein the first protective layer and the second protective layer comprise a mixture of ZnS and $SiO_2$.

10. The phase-change information recording medium according to claim 1, wherein the reflective layer comprises one of Ag and Ag alloy.

11. The phase-change information recording medium according to claim 1, wherein an interface layer is disposed between the phase-change recording layer and the first protective layer.

12. The phase-change information recording medium according to claim 11, wherein the interface layer comprises $SiO_2$ and the thickness of the interface layer is 2 nm to 10 nm.

13. The phase-change information recording medium according to claim 1, wherein the third protective layer is disposed between the second protective layer and the reflective layer.

14. A sputtering target comprising:
a composition expressed by following Formula 1, wherein the sputtering target is used for manufacturing the phase-change recording layer:

$$Sn_\alpha Sb_\beta Ga_\gamma Ge_\delta Te_\epsilon -X_\zeta$$

In above Formula 1, X represents at least one element selected from Ag, Zn, In and Cu. $\alpha$, $\beta$, $\gamma$, $\delta$, $\epsilon$ and $\zeta$ represent composition ratio (atomic percent) of each element and are expressed as follows:

$$5 \leq \alpha \leq 25, 40 \leq \beta \leq 91, 2 \leq \gamma \leq 20, 2 \leq \delta \leq 20, 0 \leq \epsilon 10,$$
$$0 \leq \zeta \leq 10 \text{ and } \alpha+\beta+\gamma+\delta+\epsilon+\zeta=100.$$

15. The sputtering target according to claim 14, which comprises the composition expressed by following Formula 1:

$$Sn_\alpha Sb_\beta Ga_\gamma Ge_\delta Te_\epsilon -X_\zeta \qquad \text{[Formula 1]}$$

In above Formula 1, X represents at least one element selected from Ag, Zn, In and Cu. $\alpha$, $\beta$, $\gamma$, $\delta$, $\epsilon$ and $\zeta$ represent composition ratio (atomic percent) of each element and are expressed as follows:

$5 \leq \alpha \leq 20, 40 \leq \beta \leq 85, 5 \leq \gamma \leq 20, 5 \leq \delta \leq 20, 0 \leq \epsilon \leq 7,$
$0 \leq \zeta \leq 7$ and $\alpha+\beta+\gamma+\delta+\epsilon+\zeta=100$.

16. The sputtering target according to claim 15, which comprises the composition expressed by following Formula 1:

$$Sn_\alpha Sb_\beta Ga_\gamma Ge_\delta Te_\epsilon - X_\zeta \qquad \text{[Formula 1]}$$

In above Formula 1, X represents at least one element selected from Ag, Zn, In and Cu. $\alpha$, $\beta$, $\gamma$, $\delta$, $\epsilon$ and $\zeta$ represent composition ratio (atomic percent) of each element and are expressed as follows:

$10 \leq \alpha \leq 20, 50 \leq \beta \leq 80, 5 \leq \gamma \leq 15, 5 \leq \delta \leq 15, 0 \leq \epsilon \leq 7,$
$0 \leq \zeta \leq 7$ and $\alpha+\beta+\gamma+\delta+\epsilon+\zeta=100$.

17. The sputtering target according to claim 14, which comprises the composition expressed by following Formula 2 and is used for manufacturing the phase-change recording layer:

$$Sn_\alpha Sb_\beta Ga_\gamma Ge_\delta \qquad \text{[Formula 2]}$$

In above Formula 2, $\alpha$, $\beta$, $\gamma$ and $\delta$ represent composition ratio (atomic percent) of each element and are expressed as follows:

$5 \leq \alpha \leq 25, 40 \leq \beta \leq 91, 2 \leq \gamma \leq 20, 2 \leq \delta \leq 20$ and $\alpha+\beta+\gamma+\delta=100$.

18. The sputtering target according to claim 17, which comprises the composition expressed by following Formula 2:

$$Sn_\alpha Sb_\beta Ga_\gamma Ge_\delta \qquad \text{[Formula 2]}$$

In above Formula 2, $\alpha$, $\beta$, $\gamma$ and $\delta$ represent composition ratio (atomic percent) of each element and are expressed as follows:

$5 \leq \alpha \leq 20, 40 \leq \beta \leq 85, 5 \leq \gamma \leq 20, 5 \leq \delta \leq 20$ and $\alpha+\beta+\gamma+\delta=100$.

19. The sputtering target according to claim 18, which comprises the composition expressed by following Formula 2:

$$Sn_\alpha Sb_\beta Ga_\gamma Ge_{67} \qquad \text{[Formula 2]}$$

In above Formula 2, $\alpha$, $\beta$, $\gamma$ and $\delta$ represent composition ratio (atomic percent) of each element and are expressed as follows:

$10 \leq \alpha \leq 20, 50 \leq \beta \leq 80, 5 \leq \gamma \leq 15, 5 \leq \delta \leq 15$ and $\alpha+\beta+\gamma+\delta=100$.

20. A manufacturing method for the phase-change information recording medium comprising:
   phase-change recording layer forming to form the phase-change recording layer by sputtering using the sputtering target comprising:
      a composition expressed by following Formula 1, wherein the sputtering target is used for manufacturing the phase-change recording layer:

$$Sn_\alpha Sb_\beta Ga_\gamma Ge_\delta Te_\epsilon - X_\zeta \qquad \text{[Formula 1]}$$

In above Formula 1, X represents at least one element selected from Ag, Zn, In and Cu. $\alpha$, $\beta$, $\gamma$, $\delta$, $\epsilon$ and $\zeta$ represent composition ratio (atomic percent) of each element and are expressed as follows:

$5 \leq \alpha \leq 25, 40 \leq \beta \leq 91, 2 \leq \gamma \leq 20, 2 \leq \delta \leq 20, 0 \leq \epsilon \leq 10,$
$0 \leq \zeta \leq 10$ and $\alpha+\beta+\gamma+\delta+\epsilon+\zeta=100$, wherein the phase-change information recording medium comprising:
      at least a first protective layer, a phase-change recording layer, a second protective layer and a reflective layer disposed on the substrate in one of this sequence and reverse sequence.

21. The manufacturing method for the phase-change information recording medium according to claim 20, which comprises initial crystallization, wherein the initial crystallization is performed at a power density of 15 mW/µm$^2$ to 40 mW/µm$^2$ while the phase-change information recording medium is rotated at a certain linear velocity within a range of 10 m/s to 21 m/s.

22. A method for using the phase-change information recording medium, wherein at least one of recording, reproducing, erasing and rewriting of information is performed by irradiating the laser beam from the first protective layer side of the phase-change information recording medium comprising:
   a substrate, and
   at least a first protective layer, a phase-change recording layer, a second protective layer, and a reflective layer disposed on the substrate in one of this sequence and reverse sequence,
   wherein the phase-change recording layer comprises a composition expressed by following Formula 1:

$$Sn_\alpha Sb_\beta Ga_\gamma Ge_\delta Te_\epsilon - X_\zeta \qquad \text{[Formula 1]}$$

In above Formula 1, X represents at least one element selected from Ag, Zn, In and Cu. $\alpha$, $\beta$, $\gamma$, $\delta$, $\epsilon$ and $\zeta$ respectively represent composition ratio (atomic percent) of each element and are expressed as follows:

$5 \leq \alpha \leq 25, 40 \leq \beta \leq 91, 2 \leq \gamma \leq 20, 2 \leq \delta \leq 20, 0 \leq \epsilon \leq 10,$
$0 \leq \zeta \leq 10$ and $\alpha+\beta+\gamma+\delta+\epsilon+\zeta=100$.

23. An optical recording apparatus wherein at least one of recording, reproducing, erasing and rewriting of information is performed by irradiating the laser beam from laser beam source to the phase-change information recording medium and the phase-change information recording medium is the phase-change information recording medium comprising:
   a substrate, and
   at least a first protective layer, a phase-change recording layer, a second protective layer, and a reflective layer disposed on the substrate in one of this sequence and reverse sequence,
   wherein the phase-change recording layer comprises a composition expressed by following Formula 1:

$$Sn_\alpha Sb_\beta Ga_\gamma Ge_\delta Te_\epsilon - X_\zeta \qquad \text{[Formula 1]}$$

In above Formula 1, X represents at least one element selected from Ag, Zn, In and Cu. $\alpha$, $\beta$, $\gamma$, $\delta$, $\epsilon$ and $\zeta$ respectively represent composition ratio (atomic percent) of each element and are expressed as follows:

$5 \leq \alpha \leq 25, 40 \leq \beta \leq 91, 2 \leq \gamma \leq 20, 2 \leq \delta \leq 20, 0 \leq \epsilon \leq 10,$
$0 \leq \zeta \leq 10$ and $\alpha+\beta+\gamma+\delta+\epsilon+\zeta=100$.

* * * * *